(12) United States Patent
Boscher et al.

(10) Patent No.: US 10,471,465 B2
(45) Date of Patent: Nov. 12, 2019

(54) METHOD FOR FORMING REGULAR POLYMER THIN FILMS USING ATMOSPHERIC PLASMA DEPOSITION

(71) Applicant: Luxembourg Institute of Science and Technology (LIST), Esch/Alzette (LU)

(72) Inventors: Nicolas Boscher, Auden le Tiche (FR); Patrick Choquet, Longeville les Metz (FR); David Duday, Luxembourg (LU); Florian Hilt, Hettange Grande (FR)

(73) Assignee: Luxembourg Institute of Science and Technology (LIST), Esch/Alzette (LU)

( * ) Notice: Subject to any disclaimer, the term of this patent is extended or adjusted under 35 U.S.C. 154(b) by 202 days.

(21) Appl. No.: 15/307,924

(22) PCT Filed: May 6, 2015

(86) PCT No.: PCT/EP2015/059979
§ 371 (c)(1),
(2) Date: Oct. 31, 2016

(87) PCT Pub. No.: WO2015/169864
PCT Pub. Date: Nov. 12, 2015

(65) Prior Publication Data
US 2017/0050214 A1  Feb. 23, 2017

(30) Foreign Application Priority Data

May 7, 2014  (LU) .......................................... 92445

(51) Int. Cl.
| | | |
|---|---|---|
| *B05D 1/00* | (2006.01) | |
| *B05D 3/04* | (2006.01) | |
| *H01J 37/32* | (2006.01) | |

(52) U.S. Cl.
CPC .......... *B05D 1/62* (2013.01); *H01J 37/32192* (2013.01); *H01J 37/32348* (2013.01); *B05D 3/0486* (2013.01); *H01J 2237/3321* (2013.01)

(58) Field of Classification Search
CPC ......... B05D 1/62; C23C 16/50; C23C 16/503; C23C 16/505; C23C 16/511; C23C 16/515; C23C 16/5826
See application file for complete search history.

(56) References Cited

U.S. PATENT DOCUMENTS

| | | | | |
|---|---|---|---|---|
| 2006/0244386 A1* | 11/2006 | Hooke | .................. | A61L 2/0011 315/111.21 |
| 2009/0202739 A1* | 8/2009 | O'Neill | .................... | B05D 1/62 427/562 |

(Continued)

FOREIGN PATENT DOCUMENTS

| | | |
|---|---|---|
| DE | 102006058771 A1 | 6/2008 |
| GB | 2493090 A | 1/2013 |

OTHER PUBLICATIONS

International Preliminary Report on Patentability dated Nov. 8, 2016 for parent PCT application PCT/EP2015/059979.

(Continued)

*Primary Examiner* — Dah-Wei D. Yuan
*Assistant Examiner* — Nga Leung V Law
(74) *Attorney, Agent, or Firm* — James E. Walton

(57) ABSTRACT

The invention provides a method for forming regular polymer thin films on a substrate using atmospheric plasma discharges. In particular, the method allows for the deposition of functional polymer thin films which require a high regularity and a linear polymer structure.

23 Claims, 8 Drawing Sheets

(56) References Cited

U.S. PATENT DOCUMENTS

| | | | | |
|---|---|---|---|---|
| 2011/0177255 A1* | 7/2011 | Badyal | ............... | B05D 1/62 |
| | | | | 427/488 |
| 2012/0121817 A1* | 5/2012 | Saito | ............... | C23C 16/0245 |
| | | | | 427/535 |
| 2013/0017341 A1* | 1/2013 | Boscher | ............... | G01N 21/783 |
| | | | | 427/489 |
| 2013/0040102 A1* | 2/2013 | Gleason | ............... | B05D 7/52 |
| | | | | 428/141 |
| 2013/0129582 A1* | 5/2013 | Eichler | ............... | B01D 17/0202 |
| | | | | 422/527 |

OTHER PUBLICATIONS

International Search Report dated Jul. 8, 2015 for parent PCT application PCT/EP2015/059979.
Written Opinion of the International Searching Authority dated Jul. 8, 2015 for parent PCT application PCT/EP2015/059979.

* cited by examiner

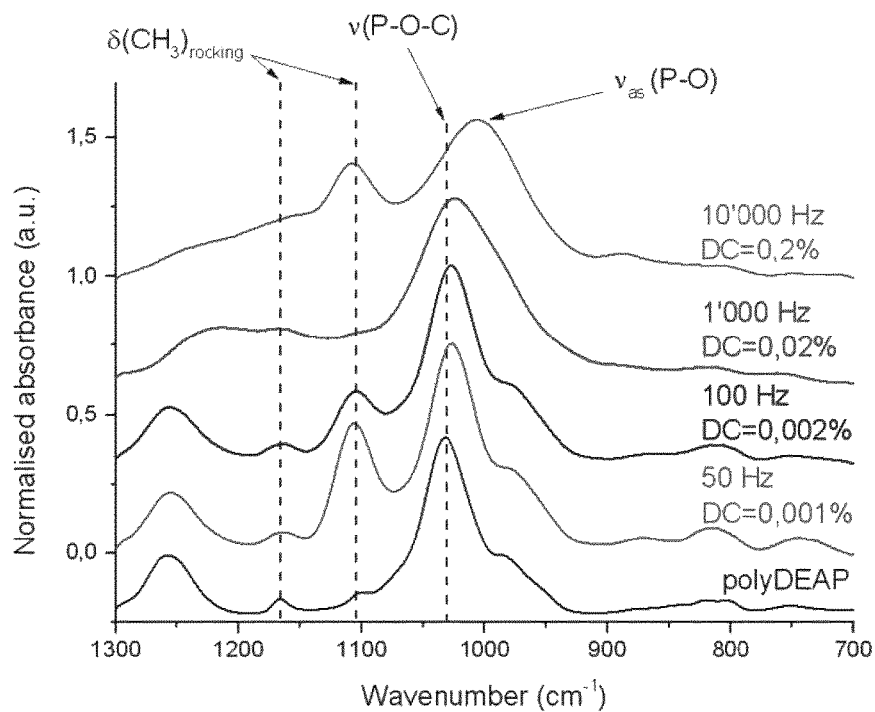
Fig. 21
Fig. 22A
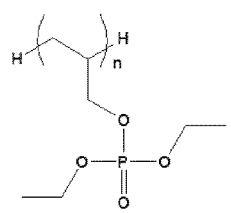
Fig. 22B
Fig. 22C
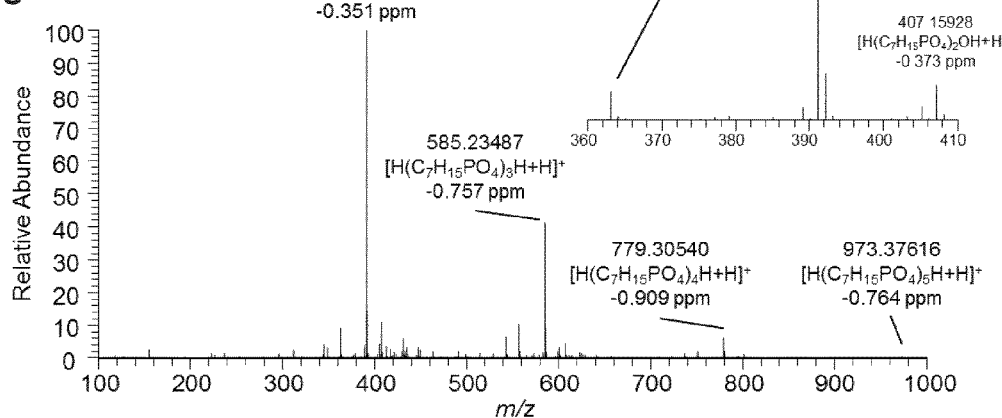

METHOD FOR FORMING REGULAR POLYMER THIN FILMS USING ATMOSPHERIC PLASMA DEPOSITION

FIELD OF THE INVENTION

The present invention lies in the field of forming polymer thin films. In particular, the invention relates to forming thin films of regular polymers using plasma deposition techniques.

BACKGROUND

Polymers are long chains of organic molecules, which are assembled from many small repeating units, the monomers. The properties of polymers are very varied and can be tuned for specific applications by properly selecting the monomer identities, as well as their configuration and microstructure.

It is known to use chemical vapor deposition, CVD, methods to form an organic coating on a substrate. CVD techniques allow for forming conformal thin films on a variety of substrate materials having a variety of geometries. The deposited films are substantially free of impurities such as solvents, initiators or plasticizers used in wet chemistry. CVD of organic coatings is usually accomplished by thermal or plasma activated processes. It is further known that variants of CVD, such as initiated chemical vapor deposition, iCVD, or oxidative CVD, oCVD, may under certain conditions be used to deposit polymer layers on a substrate. While such known processes generally generate good results, the conditions under which such processes are operated typically require a sealed and pressurized enclosure in the coating device. This is a drawback as it requires expensive and technically involved coating devices, which impede the practical applications of CVD processes in many cases.

Known plasma-enhanced chemical vapor deposition, PE-CVD, processes can be operated either at low or atmospheric pressure. They have been investigated for the deposition of organic coatings. High functional group retentions have been achieved from soft plasma discharges, including pulsed plasma discharges, which make the obtained organic coatings suitable for adhesion applications. However, the so-called plasma-polymers created during PE-CVD typically exhibit a highly branched and cross-linked three-dimensional structure composed of randomly recombined fragments, which distinguishes them from polymers synthesized by conventional methods. The complex structured plasma-polymers obtained by PE-CVD are ill suited for applications involving so-called smart functional layers, which allow for example to sense gas, which may be optically active or temperature sensitive, or which may be electrically conductive. Such functional layers require linear and regular polymer structures.

Atmospheric pressure plasma enhanced chemical vapor deposition techniques imply the use of high voltage alternating current, AC, such as for example in atmospheric pressure dielectric barrier discharge, AP-DBD. An AP-DBD process can operate at room temperature, and has been used for industrial applications such as thin film deposition, surface cleaning, sterilizing or decontaminating, wettability or adhesion enhancement. According to the prior art, regular polymer layer deposition has not been achieved using AP-DBD processes. AC AP-DBD processes rely on current discharges of several tens of microseconds, which induce a large number of random side cross-linking reactions and lead to the formation of numerous new chemical groups. Under the electron bombardment and the current channels known as filaments, pinholes and heterogeneities are formed in the deposited thin films. Such known processes are therefore hard to control, especially for obtaining the regular structures required in functional polymer thins films.

It is an objective of the present invention to propose a method for forming polymer thin films which alleviates at least some of the drawbacks that are present in the prior art.

SUMMARY OF THE INVENTION

It is an object of the invention to provide a method for forming a polymer thin film on a substrate. The method is remarkable in that it comprises the following subsequent steps:
providing a mixture comprising at least one polymer forming material;
applying a sequence of atmospheric plasma pulses to the mixture in order to form a polymer thin film on a surface portion of a substrate, which is contacted by said mixture, and wherein each plasma pulse presents a duration $t_{ON}$, comprised between one nanosecond and one microsecond, during which the plasma is discharged, and
a duration $t_{OFF}$, comprised between one microsecond and one second, during which the plasma is not discharged, and wherein the duty-cycle of a plasma discharge pulse, given by $t_{ON}/(t_{ON}+t_{OFF})$ is lower than 1%. The duty-cycle may further be lower than 0.1%.

The sequence may preferably be a periodic sequence.

Preferably, each plasma discharge may be generated by a voltage pulse, which rises to the plasma discharge breakdown voltage in one nanosecond to one microsecond. Alternatively, a pulsed microwave discharge may be used to induce the pulsating discharges of the plasma. The plasma discharge may be a homogeneous dielectric barrier discharge, a corona discharge or an arc discharge.

Preferably, the voltage rise rate of the voltage pulse may be of at least $10 \text{ V·ns}^{-1}$ in absolute value. The same may preferably apply to the voltage fall rate of the voltage pulse.

The voltage pulses may preferably be repeated at a frequency which is lower than one kHz, preferably lower than one hundred Hz.

The voltage pulse may further be a square wave voltage pulse. It may further be preferred that the duration of a square voltage pulse is comprised between one nanosecond and one microsecond. The square wave may be a bipolar or a positive or negative unipolar square wave.

Preferably, the polymer forming material may be a monomer. The monomer may for example be selected from molecules comprising at least one polymerisable group, including unsaturated groups (e.g. double bonds such as allyl, vinyl or acrylic groups and triple bonds such as ethynyl) or from molecules having a cyclic structure.

Among the virtually infinite list of monomers that can be deposited by the method described herein, can be cited: N-isopropylacrylamide (NIPAAm), suitable for the growth of temperature responsive polymers; heptadecafluorodecylmethacrylate (HFDMA), suitable for the preparation of superhydrophobic surfaces; perfluoroalkylethylmethacrylate (PFEMA), suitable for the preparation of icephobic surfaces; hexafluoropropylene oxide (HFPO), suitable for the preparation of water purification membranes; di(ethyleneglycol) divinylether (DEGDVE), suitable for the cross-linking of linear polymer chains in order to prevent their dissolution and enhance their stability; glycidylmethacrylate (GMA), suitable for the deposition of epoxy functionalized layers for adhesion and grafting applications; 1-ethyl-3-vinylimidazolium bis(trifluoromethylsulfonyl)imide ([EVIm][TFSI]), suitable for the formation of polymerized ionic liquid (PIL); 1,3,5-trimethyl-1,3,5-trivinylcyclotrisiloxane (V3D3), suitable for deposition of ultrathin polymer insulating layers; diethylaminoethylmethacrylate (DEAEMA), suitable for the deposition of tertiary amine functionalized polymer for adhesion and grafting applications; 2,4,6,8-tetravinyl-2,4,6,8-tetramethylcyclotetrasiloxane (V4D4), suitable for the deposition of thin film electrolytes doped by lithium ions; 1H,1H,2H,2H-perfluorodecylacrylate (PFDA), suitable for the preparation of proton exchange membrane fuel cells (PEMFC); acrylic acid (AA), suitable for the formation of biocompatible polymer for use as a polyelectrolyte in biomedical applications; vinylpyrrolidone (VP), suitable for the deposition of hydrogel materials; methacrylic acid (MAA), suitable for applications where a carboxylic acid moiety is required; o-nitrobenzyl methacrylate (oNBMA), suitable for the formation of hydrophobic photoresponsive polymer thin films; propargyl methacrylate (PMA), suitable for the deposition of click active polymer thin films; hydroxyethylmethacrylate (HEMA), suitable for the deposition of hydrogel thin films with hydrophilic hydroxyl moieties and high swelling capabilities; ethylene glycol diacrylate (EGDA), suitable for the preparation of pH responsive polymer layers; divinyl benzene (DVB), suitable for the formation of gas separation membranes; 2-(perfluorooctyl)ethyl methacrylate (PFOEMA), suitable for the formation of superhydrophobic surfaces; methylmethacrylate (MMA), suitable the deposition of light protecting polymer layers; di(ethylene glycol) di(vinyl ether), suitable for the preparation of pH-responsive layers; 2-(dimethylamino)ethyl methacrylate, suitable for the deposition of zwitterionic thin films; ethylene glycol dimethacrylate, suitable for the preparation of reverse osmosis membranes; diethylallylphosphate (DEAP), suitable for the deposition of char-forming protective coatings; zinc 5,10,15,20-(tetra-4-ethenylphenyl)porphyrin, suitable for colorimetric gas sensing applications; chromium 5,10,15,20-(tetra-4-ethynylphenyl)porphyrin, suitable for the formation of thin film catalysts; iron 5,10,15,20-(tetra-4-vinylphenyl)porphyrin; aminostyrene (AS), suitable for the preparation of surfaces with high densities of functionalizable —NH$_2$ groups; 1-vinyl-2-pyrrollidone (VP), suitable for the deposition of hydrophilic, biocompatibile and antifouling polymer layers; 2-(dimethylamino)ethyl methacrylate (DMAEMA), suitable for the preparation of antifouling surfaces; 2-(diisopropylamino) ethyl methacrylate (PDPAEMA), suitable for the preparation of surfaces that can switch between superhydrophobic and superhydrophilic states; cyclohexyl methacrylate (CHMA), suitable for the coating of microfluidic channels; methyl ether methacrylate (MeMA), suitable for the deposition of polymer electrolyte thin films for lithium-ion batteries; meta-diethynylbenzene (MDEB), suitable for the deposition of semiconducting polymer thin films; ethylene glycol, suitable for the deposition of water soluble polymer thin films; diethylaminoethylacrylate (DEAEA); dimethylaminomethylstyrene (DMAMS); maleic anhydride (MA); hexavinyldisiloxane (HVDSO); ethyl acrylate; propyl acrylate; butyl acrylate; pentyl acrylate; hexyl acrylate; 2-hydroxyethylmethacrylate; vinyltrimethylsilicon (VTMS); vinylidenedifluoride (VDF); neopentyl methacrylate (NPMA); cyclohexyl methacrylate (CHMA); ethylene dimethacrylate (EDMA); 4-vinylpyridine (4VP); dimethylacrylamide; 2-hydroxyethyl methacrylate; perfluoroalkyl ethyl methacrylate; pentafluorophenylmethacrylate (PFM); trivinylpentamethyltrisiloxane (TVTSO); dimethylaminoethyl methacrylate; perfluoroalkyl ethyl methacrylate (PFEMA); vinyl alcohol (VA); ethylene glycol dimethacrylate (EGDMA); n-vinyl-2-caprolactam (NVCL); 2,4,6,-trimethyl-2,4,6,-trivinylcyclotrisilazane; 1,3,5,7-tetramethyl-1,3,5,7-tetravinylcyclotetrasilazane; vinyl acetate, suitable for adhesion applications; vinyl chloride; styrene; and propylene.

The mixture and/or the polymer forming material may preferably be a gas, vapor, liquid, aerosol or solid.

The mixture may preferably comprise at least one organic solvent. The solvent may for example be selected from the group comprising Acetic acid, Acetone, Acetonitrile, n-Pentanol, n-Butanol, 2-Methyl-2-Propanol, Butylacetate, Chlorobenzene, Chloroform, Cyclohexane, Dichloromethane, Diethylether, 1,2,-Dichloroethylene, Diisopropylether, Dioxane, Dimethylformamide, Ethanol, Ethylacetate, Ethylmethylketone, Heptane, Hexane, Isopropylalcohol, 3-Methyl-1-Butanol, Methanol, Pentane, n-Propylalcohol, Pentachloroethane, 1,1,2,2,-Tetrachloroethane, 1,1,1,-Trichloroethane, Tetrachloroethylene, Tetrachloromethane, Tetrahydrofurane, Toluene, Trichloroethylene, Water, Xylene.

The surface portion of the substrate that is contacted with said mixture may preferably comprise an insulating, semiconducting or conducting material.

The substrate and/or the plasma deposition chamber may preferably be provided at a temperature between −50 and 20° C. The substrate and/or the plasma deposition chamber may preferably be provided at a temperature between 20 and 100° C.

Preferably, the process gas may comprise at least one gas selected from the group comprising argon, carbon dioxide, helium, hydrogen, nitrogen and oxygen.

Preferably, the plasma process gas may comprise at least one polymer forming material.

Preferably, the substrate and plasma may be provided in an enclosure comprising an atmosphere which comprises at least 99% of Ar, He, N$_2$ or air.

The plasma process gas may preferably comprise a gaseous polymerization initiator. The gaseous initiator may further preferably be selected from the group comprising peroxides, aryl ketones and alkyl azo compounds.

The plasma process gas may preferably comprise an oxidizing agent. The oxidizing agent may further preferably be selected from the group comprising bromine, bromide compounds, chlorine, chloride compounds, chlorite compounds, chlorate compounds, chromate compounds, chromic acid, dichromic acid, dichromate compounds, perchlorate compounds, fluorine, fluoride compounds, hexavalent chromium compounds, hydrogen peroxide, hypochlorite compounds, hypohalite compounds, inorganic peroxides, iodine, iodide compounds, nitrate compounds, nitric acid, nitrous oxide, osmium tetroxide, oxygen, ozone, peroxydisulfuric acid, peroxymonosulfuric acid, potassium nitrate, silver oxide, sodium perborate, sulfuric acid and water.

The invention provides a method for forming functional and so-called smart polymer thin films, which require regular and linear polymer structures. By using methods in accordance with the present invention, conventional linear polymer or copolymer thin films may be grown by chain growth polymerization, by free radical polymerization, by controlled free radical polymerization, by step growth polymerization, by controlled oxidative polymerization and by ring opening polymerization. The process is operable at atmospheric pressure or pressures close to atmospheric pressure, which alleviates the need for equipment having sealed and pressure regulated deposition enclosures. This also allows the use of the process on substrates having complex geometries, as known processing enclosures are easily adapted for use with the process according to the invention. The method according to the invention does not necessarily require initiating agents or oxidants as it is the case in known CVD processes. The invention relies on very short current discharges, which may for example be induced by voltage pulses with fast rise time. It therefore uses less energy than known AP-DBD methods which use AC sinusoidal pulsed plasma at much higher duty-cycles. Less energy is therefore absorbed by the substrate, the temperature of which is not significantly altered by the impact of the pulsed plasma discharges. This in turn allows controlling the temperature of the substrate during deposition. For example, the substrate may be heated, which promotes the desorption of shorter polymer chains and smaller oligomers. Alternatively, the substrate may be cooled during deposition, thereby promoting the condensation of the monomer on the substrate's surface, which enhances the deposition rate. Due to the fast voltage rise time, short square pulsed AP-DBD in accordance with the invention is operating with distinct discharge current pulses at the voltage rising and falling phases. The produced short current discharge, with a large proportion of high energy electrons, efficiently induces the formation of free radicals that initiate the free radicals polymerization process. The short current discharge duration allows the use of duty-cycles far below 0.1%, while keeping $t_{OFF}$ in the millisecond range. The impact of the plasma discharge on the resulting thin film chemistry is thus minimized. On the other hand, the free radical polymerization reaction, occurring during more than 99.9% of the deposition process, is massively favored. Therefore, thin films composed of well-defined and defect-free polymer repeat units are grown using the invention.

To the best of the inventors' knowledge, there has so far been no scientific evidence showing that the ignition of ultra-short atmospheric plasma discharges using very low repetition frequencies can induce a linear polymerization process.

BRIEF DESCRIPTION OF THE DRAWINGS

In what follows, the invention will be described through preferred embodiments and based on the figures, among which:

FIG. 21 illustrates FTIR spectra of DEAP plasma polymers formed using a preferred embodiment of the invention and of the polyDEAP synthesized by a known free-radical polymerization method;

FIGS. 22a-c show AP-MALDI-HRMS spectra of a polymer thin film formed using a preferred embodiment of the invention.

DETAILED DESCRIPTION

Figure 1:
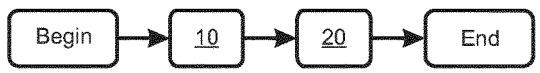
FIG. 1 is a flow chart illustrating the main method steps according to a preferred embodiment of the invention.

FIG. 1 is a flow chart, which illustrates the main steps of a preferred embodiment of the invention. In a first step 10, a mixture comprising at least one polymer forming material is provided. While the mixture may consist in only the polymer forming material as such, it may alternatively comprise other components, such as for example an organic solvent. The inclusion of such additional components may for example have an impact on the film deposition rate or on the porosity of the deposited layer. The polymer forming material is advantageously a monomer, which is chosen so that the regular and linear polymer chain comprising the monomer exhibits the properties, which the targeted application requires. Among the virtually infinite list of monomers that can be deposited by the method described herein, can be cited: N-isopropylacrylamide (NIPAAm), suitable for the growth of temperature responsive polymers; heptadecafluorodecylmethacrylate (HFDMA), suitable for the preparation of superhydrophobic surfaces; perfluoroalkylethylmethacrylate (PFEMA), suitable for the preparation of icephobic surfaces; hexafluoropropylene oxide (HFPO), suitable for the preparation of water purification membranes; di(ethyleneglycol)divinylether (DEGDVE), suitable for the cross-linking of linear polymer chains in order to prevent their dissolution and enhance their stability; glycidylmethacrylate (GMA), suitable for the deposition of epoxy functionalized layers for adhesion and grafting applications; 1-ethyl-3-vinylimidazolium bis(trifluoromethylsulfonyl)imide ([EVIm][TFSI]), suitable for the formation of polymerized ionic liquid (PIL); 1,3,5-trimethyl-1,3,5-trivinylcyclotrisiloxane (V3D3), suitable for deposition of ultrathin polymer insulating layers; diethylaminoethylmethacrylate (DEAEMA), suitable for the deposition of tertiary amine functionalized polymer for adhesion and grafting applications; 2,4,6,8-tetravinyl-2,4,6,8-tetramethylcyclotetrasiloxane (V4D4), suitable for the deposition of thin film electrolytes doped by lithium ions; 1H,1H,2H,2H-perfluorodecylacrylate (PFDA), suitable for the preparation of proton exchange membrane fuel cells (PEMFC); acrylic acid (AA), suitable for the formation of biocompatible polymer for use as a polyelectrolyte in biomedical applications; vinylpyrrolidone (VP), suitable for the deposition of hydrogel materials; methacrylic acid (MAA), suitable for applications where a carboxylic acid moiety is required; o-nitrobenzyl methacrylate (oNBMA), suitable for the formation of hydrophobic photoresponsive polymer thin films; propargyl methacrylate (PMA), suitable for the deposition of click active polymer thin films; hydroxyethylmethacrylate (HEMA), suitable for the deposition of hydrogel thin films with hydrophilic hydroxyl moieties and high swelling capabilities; ethylene glycol diacrylate (EGDA), suitable for the preparation of pH responsive polymer layers; divinyl benzene (DVB), suitable for the formation of gas separation membranes; 2-(perfluorooctyl)ethyl methacrylate (PFOEMA), suitable for the formation of superhydrophobic surfaces; methylmethacrylate (MMA), suitable the deposition of light protecting polymer layers; di(ethylene glycol) di(vinyl ether), suitable for the preparation of pH-responsive layers; 2-(dimethylamino)ethyl methacrylate, suitable for the deposition of zwitterionic thin films; ethylene glycol dimethacrylate, suitable for the preparation of reverse osmosis membranes; diethylallylphosphate (DEAP), suitable for the deposition of char-forming protective coatings; zinc 5,10,15,20-(tetra-4-ethenylphenyl)porphyrin, suitable for colorimetric gas sensing applications; chromium 5,10,15, 20-(tetra-4-ethynylphenyl)porphyrin, suitable for the formation of thin film catalysts; iron 5,10,15,20-(tetra-4-vinylphenyl)porphyrin; aminostyrene (AS), suitable for the preparation of surfaces with high densities of functionalizable —NH$_2$ groups; 1-vinyl-2-pyrrollidone (VP), suitable for the deposition of hydrophilic, biocompatibile and antifouling polymer layers; 2-(dimethylamino)ethyl methacrylate (DMAEMA), suitable for the preparation of antifouling surfaces; 2-(diisopropylamino) ethyl methacrylate (PDPAEMA), suitable for the preparation of surfaces that can switch between superhydrophobic and superhydrophilic states; cyclohexyl methacrylate (CHMA), suitable for the coating of microfluidic channels; methyl ether methacrylate (MeMA), suitable for the deposition of polymer electrolyte thin films for lithium-ion batteries; meta-diethynylbenzene (MDEB), suitable for the deposition of semiconducting polymer thin films; ethylene glycol, suitable for the deposition of water soluble polymer thin films; diethylaminoethylacrylate (DEAEA); dimethylaminomethylstyrene (DMAMS); maleic anhydride (MA); hexavinyldisiloxane (HVDSO); ethyl acrylate; propyl acrylate; butyl acrylate; pentyl acrylate; hexyl acrylate; 2-hydroxyethylmethacrylate; vinyltrimethylsilicon (VTMS); vinylidenedifluoride (VDF); neopentyl methacrylate (NPMA); cyclohexyl methacrylate (CHMA); ethylene dimethacrylate (EDMA); 4-vinylpyridine (4VP); dimethylacrylamide; 2-hydroxyethyl methacrylate; perfluoroalkyl ethyl methacrylate; pentafluorophenylmethacrylate (PFM); trivinylpentamethyltrisiloxane (TVTSO); dimethylaminoethyl methacrylate; perfluoroalkyl ethyl methacrylate (PFEMA); vinyl alcohol (VA); ethylene glycol dimethacrylate (EGDMA); n-vinyl-2-caprolactam (NVCL); 2,4,6,-trimethyl-2,4,6,-trivinylcyclotrisilazane; 1,3,5,7-tetramethyl-1,3,5,7-tetravinylcyclotetrasilazane; vinyl acetate, suitable for adhesion applications; vinyl chloride; styrene; and propylene. The skilled person will be able to choose the polymer forming material as required by a specific application. Such applications preferably comprise the use of smart or highly functional polymer layers and/or coatings. The substrate on which the polymer thin film is to be formed is for example a conducting or a semiconducting material. Alternatively, the substrate may be any insulating material. The substrate may for example be glass, or metal such as steel. In particular, the substrate may have a planar or a three-dimensional geometry. Depending on the geometry and the means used for contacting the substrate with the mixture, the latter may be provided in gaseous form, as a vapor, as a liquid, as an aerosol or as a solid.

During the subsequent step 20 the polymer thin layer is formed on the surface portion. To that end, a sequence of atmospheric plasma pulses is applied to the mixture. The low frequency and ultra-short pulsed atmospheric plasma discharge has very little influence on the monomer, reactor and substrate temperatures. The temperatures of the monomer mixture, of the reactor chamber and of the substrate may all be tuned independently. This entails the formation of free radicals, which contact the substrate surface, or which interact with other radicals present on the substrate surface portion. The pulsed plasma is characterized by the nature of the discharge pulses. Specifically, each pulse presents a duration $t_{ON}$ during which the plasma is discharged, and a duration $t_{OFF}$ during which the plasma is not discharged. The total duration of a pulse is given by the sum of $t_{ON}$ and $t_{OFF}$. While the discharge time $t_{ON}$ is very short in the range of 1 ns to 1 μs, the inactive time $t_{OFF}$ is much longer, ranging from about 1 μs to 1 second. The two durations are selected so that the discharge time is much shorter than the resting time. Therefore, the duty-cycle of a plasma pulse, expressed by the ratio $t_{ON}/(t_{ON}+t_{OFF})$ is advantageously lower than 1%, and preferably even lower than 0.1%. Depending on the pulsation frequency of the plasma, a thin layer is formed in 1 to 100 seconds.

During the time period when the plasma is discharged, different ions, metastables, electrons and radicals are created and start initiation reactions. Meanwhile, in the much longer time period when the plasma is not discharged, the ions, metastables and electrons rapidly disappear, while the formed free radicals ensure the polymerization of the components containing polymerizable groups. According to the invention, this second phase is massively favored.

This describes the principle underlying the present invention in general terms. Further details will be given in the preferred embodiment described herein.

Figure 2:
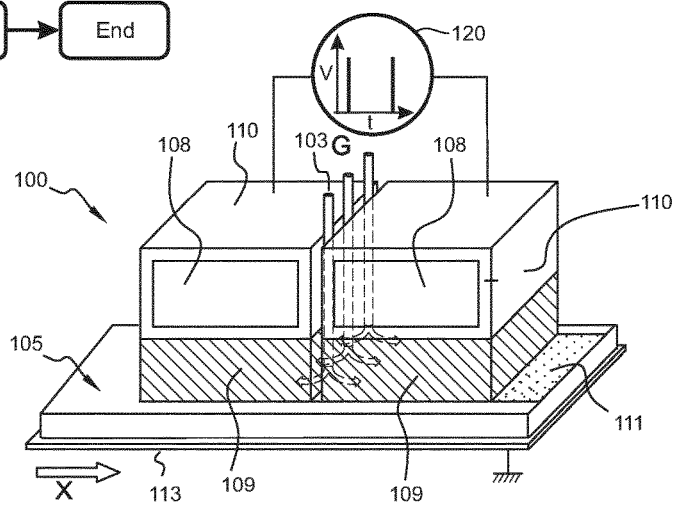
FIG. 2 is a schematic illustration of a preferred embodiment of a device for carrying out the invention.

FIG. 2 shows a schematic view of an exemplary and non-limiting embodiment of a device 100 for implementing the method in accordance with the invention. A stage 113 transports the substrate 105, of which a surface portion is to be coated, along the direction X. The portion of the substrate 105 is moved through a plasma zone 109 in which the substrate is exposed to pulsed atmospheric pressure plasma. In the illustrated example, the dielectric barrier discharge plasma is provided by a system of two electrodes 108 arranged side by side and having a slot between them, through which a process gas G may pass to be directed in the direction of the substrate 105. The mixture 103 comprising the polymer forming material is in gaseous form. It is brought into the proximity of the substrate 105 together with the process gas G. Both electrodes 108 are coated with a dielectric layer 110. Being exposed to the pulsed dielectric barrier discharge plasma, the polymer forming material forms a polymer layer on the substrate 105. The pulsed plasma is induced by a high voltage pulse generator 120, which is operatively connected to the electrodes. The generator 120 is operated to apply voltage pulses which have a rising time that allow the plasma discharge breakdown voltage to be reached within 1 nanosecond to 1 microsecond, preferably within 1 nanosecond to 0.1 microsecond. The generator is operated to produce substantially square shaped ultra-short high voltage pulses, having a duty cycle of less than 1%, and preferably less than 0.1%. Such signal generators are available in the art and known to the skilled person, and will therefore not be described in further detail in the context of the present invention. The pulsating frequency is less than 10 kHz, preferably less than 1 kHz and even more preferably less than 100 Hz. Having passed the plasma zone 109, the substrate 105 comprises a polymer thin film 111, which comprises regular and linear polymer structures. Although not depicted, the above mentioned steps may be carried out several times. Furthermore, the method is carried out at atmospheric or close-to atmospheric pressures, i.e., at pressures of between $5 \cdot 10^4$ Pa and $2 \cdot 10^5$ Pa.

Figure 3:
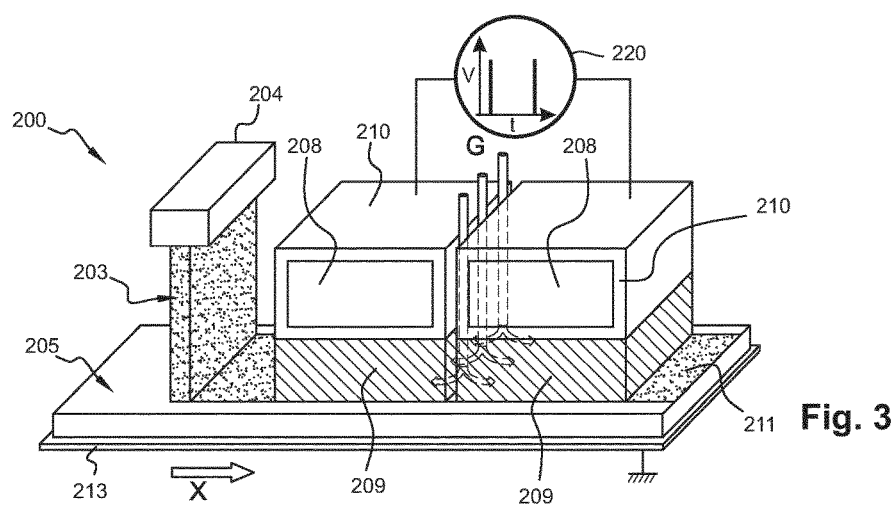
FIG. 3 is a schematic illustration of a preferred embodiment of a device for carrying out the invention.

The alternative embodiment of a device 200 for carrying out the invention as shown in FIG. 3 is similar to the embodiment of FIG. 2, with the following exceptions. The mixture 203 comprising the polymer forming material is deposited, sprayed or vaporized using an atomizing nozzle 204 onto a portion of a substrate 205. The pre-treated substrate is then subjected to the pulsed plasma 209. Both zones do not overlap, or are spatially distinct.

In particular, by using the AP-DBD setup as described in FIG. 3, an afterglow region is surrounding the plasma discharge. Hence, the formed layer would first be exposed to the afterglow region, which is softer than the direct plasma discharge, and the polymerization process would already start in this region. The lateral extension of an afterglow region could be for instance between 1% and 20% of the extension of the plasma zone 209.

The method for forming a polymer thin film on a substrate can be conducted using any kind of atmospheric pressure plasma discharges, including, but not limited to, dielectric barrier discharges, corona discharges and arc discharges. The discharge is initiated between a minimum of two electrodes where one of the electrodes can be the substrate to be coated. In the case of a discharge generated between a high-voltage electrode and the substrate, the substrate is said to be directly exposed to the plasma discharge. The embodiments illustrated by FIGS. 2 and 3 schematically illustrate devices in which the substrate is directly exposed to the plasma discharge. Such embodiments are particularly suitable for the coating of planar substrates.

Figure 4:
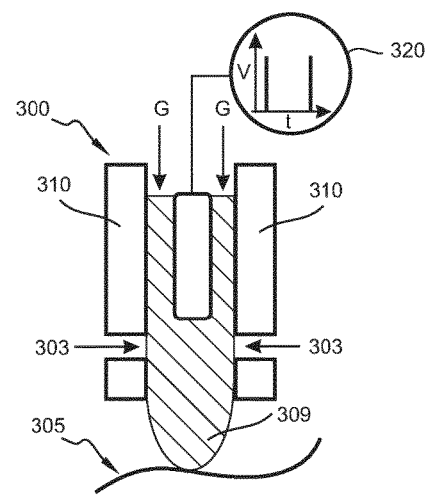
FIG. 4 is a schematic illustration of a preferred embodiment of a device for carrying out the invention.

FIG. 4 shows a schematic view of an exemplary and non-limiting embodiment of a remote discharge device 300 for implementing the method on 3D substrates 305 in accordance with the invention. The discharge is initiated inside the reactor 310 between a minimum of two electrodes where one of the electrodes is the high voltage electrode and the other is ground electrode. The plasma discharge 309 is generated remotely, upstream of the substrate 305. In the case of a discharge generated upstream of the substrate, the substrate is exposed to the plasma discharge afterglow or the plasma jet (also called guided streamer). Remote discharges are particularly suitable for the treatment of 3D substrates.

In all configurations, the polymer forming material can be directly exposed to the plasma discharge or to the plasma discharge afterglow region or to the plasma jet region.

The following preferred embodiments describe two different experimental setups for carrying out the method according to the invention, and results obtained therewith.
1. Atmospheric Pressure Plasma-Initiated Chemical Vapor Deposition Using Ultra-Short Square Pulse Dielectric Barrier Discharge.

The following describes a scalable method in accordance with the present invention, for the atmospheric pressure plasma-initiated chemical vapor deposition of conventional polymers. Ultra-short pulse dielectric barrier discharge, which allows high deposition rates even for plasma duty cycles as low as 0.01%, is used to deposit a polymer layer. An excellent retention of the labile functional epoxy groups is revealed by FTIR and XPS. The polymer structure of the thin films is evidenced by matrix-assisted laser desorption/ionization high-resolution mass spectrometry. Polymer molecular weights of up to 30,000 g·mol$^{-1}$ were found by size exclusion chromatography, SEC, highlighting the suitability of the method according to the invention for the deposition of polymer layers.
1.1. Experimental Part
1.1.1. Atmospheric Pressure Plasma-Initiated Chemical Vapor Deposition and Materials Polymerized poly(glycidyl methacrylate), PGMA, and ppGMA thin films were deposited in an atmospheric pressure dielectric barrier discharge reactor, as previously described. Two different electrical excitations were investigated to ignite the plasma discharge.

On the one hand, ultra-short square pulse DBD, in accordance with the present invention, was generated using an AHTPB10F generator from EFFITECH™ (Gif-sur-Yvette, France) generating 1 ρs square peaks of 2 kV. Duty cycles from 0.01% to 1% were investigated by varying the peak repetition frequency from 100 to 10,000 Hz.

On the other hand, alternating current DBD was ignited using a Corona generator 7010R from SOFTAL Corona & Plasma GmbH (Hamburg, Germany) generating a 10,000 Hz sinusoidal signal of 1 kV. The AC discharge $t_{ON}$ was maintained to 1 ms and duty-cycles, DC, from 0.1 to 100% were investigated. The discharge current and voltage signals were measured using a current probe (Lecroy™, CP030) and a high voltage probe (Lecroy™, PPE 20 kV). The waveforms were recorded using an oscilloscope (LeCroy™, Wavesurfer 42XS, 400 MHz). The liquid monomer, glycidyl methacrylate, GMA (Sigma Aldrich™, 97%) used without further purification, was injected into the reactor using a classic bubbler system. Argon (Air Liquide™, 99.999%), used as a process and carried gas, was flushed through the bubbler at 15 l·min$^{-1}$. Overall argon flow through the reactor was maintained to 20 l·min$^{-1}$ for all experiments. The aluminum (Eurofoil™, Dudelange, Luxembourg) and silicon wafer (Siltronix™, Archamps, France) substrates were cleaned by a 30 s exposure to a 95:5 nitrogen:oxygen (Air Liquide™, 99.999%) AP-DBD plasma (1 W·cm$^{-2}$). Conventionally polymerized PGMA powder (Sigma Aldrich™, M$_n$~20,000 g·mol$^{-1}$) was also characterized for comparison.
1.1.2. Analytical Techniques The scanning electron microscope, SEM, observations and film thickness measurements were performed on a Hitachi™ SU-70 FE-SEM. Prior to SEM observations, the non-conductive samples were sputter coated with 5 nm of platinum to prevent charging and distortion. Fourier Transform Infrared Spectroscopy, FTIR, analyses were performed on a Bruker™ Hyperion 2000 spectrometer equipped with a Ge-ATR-crystal. X-ray photoelectron spectroscopy, XPS, analyses were realized with a Kratos™ Axis-Ultra DLD instrument using a monochromatic Al Kα X-ray source (hu=1486.6 eV) at pass energy of 20 eV. Atmospheric pressure matrix-assisted laser desorption/ionization high-resolution mass spectrometry, AP-MALDI-HRMS, analyses were performed using a AP-MALDI PDF+ ion source from MassTech™ Inc. (Columbia, Mass.) coupled to a LTQ/Orbitrap Elite from Thermo Scientific™ (San Jose, Calif.). Prior to analysis, the sample surface was modified by spotting 0.2 μL of a solution of α-cyano-4-hydroxycinnamic acid (10 mg·mL$^{-1}$ in methanol/water with 0.1% trifluoro-acetic acid, 50:50 v/v) directly onto the sample surface. Once evaporated, the solution leads to a co-crystallization of matrix with analytes from the sample surface to promote the ionization efficiency and limit the laser-induced fragmentation. Size exclusion chromatography, SEC, was performed using the 1200 series system from Agilent Technologies™ (Diegem, Belgium) equipped with a PLgel MIXED-D 5 mm SEC column, designed for molecular weight up to 400,000 g·mol$^{-1}$ poly(styrene) equivalent and a refractive index detector, RID. OmniSEC™ software version 4.6.1 (Malvern Instruments, United Kingdom) was used for data acquisition and treatment. The number average and weight average molecular weights calculations ($M_n$ and $M_w$, respectively) were computed using the conventional calibration method using a set of poly(methyl methacrylate) standards purchased from Sigma Aldrich™ (St Louis, Mo.). Samples were dissolved in HPLC grade THF (1 mg·ml$^{-1}$) and analyzed at a 1 mL·min$^{-1}$ flow rate. MALDI-MS mass spectra were recorded using a Bruker™ Autoflex III mass spectrometer (Bruker Daltonics, Leipzig, Germany) equipped with a frequency-tripled Nd-YAG laser (λ=355 nm) operating at a pulse rate of 50 Hz. Ions were accelerated by a positive 19 kV voltage with a pulsed ion extraction device (based on the mass range of interest, around 10 ns in that case). The time-of-flight analyzer was operated in reflectron mode and ions were detected using a microchannel plate detector. Calibration was performed using both matrix peaks (internal calibration) and poly(ethylene glycol) standards (external calibration, solvent-free deposits, with CHCA as matrix and LiTFA as cationization salt). FlexControl™ software version 3.0 (Bruker Daltonics) was used for instrument control and data acquisition, while both FlexAnalysis™ software version 3.0 (Bruker Daltonics) and mMass version 5.5 were used for data processing. α-cyano-4-hydroxycinnamic acid, CHCA, was purchased from Bruker Daltonics™ (Leipzig, Germany). Lithium trifluoroacetate, LiTFA, trans-2-[3-(4-tert-Butylphenyl)-2-methyl-2-propenylidene]malononitrile, DCTB, and poly(ethylene glycol) standards ($M_n$=600, 1,000, 2,000 and 3,000 g·mol$^{-1}$) were from Sigma-Aldrich™ (St Louis, Mo.). All the samples were submitted to a solvent-free preparation, consisting of grinding the matrix (CHCA for calibrants and DCTB for analytes) together with the polymer and LiTFA doping salt with a mortar and a pestle for about 5 min at room temperature. The matrix/polymer/salt molar ratios were roughly optimized for each sample. A few grains of the so-produced solid mixture were applied to the MALDI target then pressed with a small spatula to form a thin film submitted to mass analysis.

1.2. Results and Discussion 1.2.1. Short Square Pulse Dielectric Barrier Discharge for the Free Radical Polymerisation of PGMA Layers To illustrate the benefit of ultra-short square pulse dielectric barrier discharge, a second series of thin films has been deposited in the same AP-DBD reactor fed with argon and GMA vapors using sinusoidal alternating current. In both cases, different $t_{ON}$, $t_{OFF}$ and duty cycle have been investigated and are summarized in Table I and Table II. $t_{ON}$ was maintained to 1 μs and 1 ms for the short square pulse and alternating current AP-DBD experiments, respectively. Plasma-off time up to 9999 μs, allowing to investigate DC down to 0.01%, was investigated for the short square pulse AP-DBD trials, while $t_{OFF}$ up to 999 ms, i.e. 0.1% DC, was considered in the alternating current AP-DBD case.

TABLE I

Discharge conditions and growth rates for the thin films deposited from a 1 μs square-wave pulse AP-DBD

| Sample | $t_{ON}$ (μs) | $t_{OFF}$ (μs) | DC (%) |
|---|---|---|---|
| A1 | 1 | 99 | 1 |
| A2 | 1 | 315 | 0.3 |
| A3 | 1 | 999 | 0.1 |
| A4 | 1 | 3164 | 0.03 |
| A5 | 1 | 9999 | 0.01 |

TABLE II

Discharge conditions and growth rates for the thin films deposited from a 10,000 Hz alternating current AP-DBD

| Sample | $t_{ON}$ (ms) | $t_{OFF}$ (ms) | DC (%) |
|---|---|---|---|
| B1 | 1 | 0 | 100 |
| B2 | 1 | 2 | 33 |
| B3 | 1 | 9 | 10 |
| B4 | 1 | 32 | 3 |
| B5 | 1 | 99 | 1 |
| B6 | 1 | 315 | 0.3 |
| B7 | 1 | 999 | 0.1 |

Figure 5:
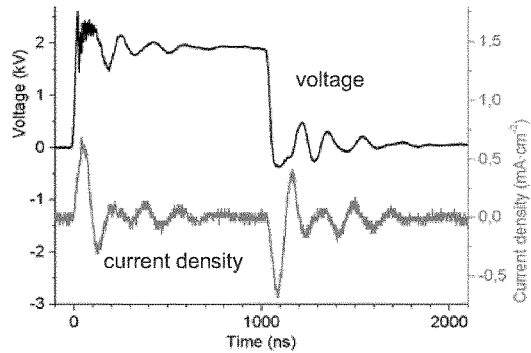
FIG. 5 plots the applied voltage and associated plasma current discharge measured while using a preferred embodiment of the invention.
Figure 6:
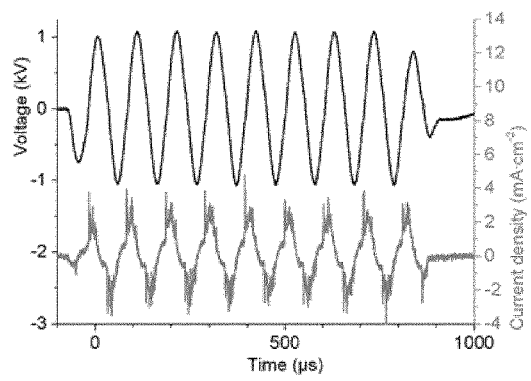
FIG. 6 plots the applied voltage and associated plasma current discharge measured while using a prior art method.

FIGS. 5 and 6 show the gas applied external voltage and the current density measured for short square pulse and alternating current AP-DBD, respectively. Short square pulse AP-DBD is observed to operate in a homogeneous mode with distinct discharge current pulses at the voltage rising and falling phases (FIG. 5), while AC AP-DBD shows a filamentary discharge (FIG. 6) with numerous chaotic filament current peaks. The fast voltage rise, 2 kV reach in 30 ns, induces a first positive discharge current pulse with a duration of about 100 ns and an amplitude of 0.6 mA·cm$^{-2}$. A negative current peak of the same duration and same amplitude is occurring at the voltage fall.

1.2.2. Characterization of the Polymerized poly(glycidyl methacrylate), PGMA, Layers The atmospheric pressure dielectric barrier discharge deposition of glycidyl methacrylate, irrespective of the different electrical excitations studied in this embodiment (Tables I and II), led to the deposition of macroscopically smooth and adherent thin films across the whole length of the substrate. All the deposited films were stable upon immersion and wiping in water and absolute ethanol. Apart from obvious growth rate differences, the films were indistinguishable from each other. SEM confirmed that all the films deposited covered the whole substrate and were smooth with no particle formation.

Figure 7:
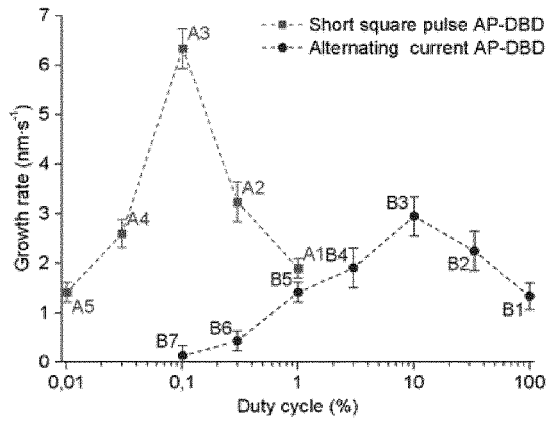
FIG. 7 plots the growth rates dependence of polymer thin films on discharge pulse duty cycle for a preferred embodiment of the invention and for a prior art method.
Figure 8:
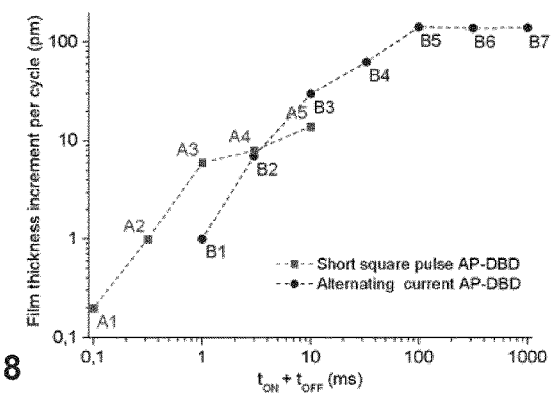
FIG. 8 plots the polymer thin film thickness increment per growth cycle as a function of cycle duration for a preferred embodiment of the invention and for a prior art method.

The dependence of the film deposition rate on the plasma electrical excitation and duty cycle was investigated by cross-sectional SEM. The film deposition rates achieved from alternating current AP-DBD (FIG. 7), with a maximum obtained for a DC of 10%, are in agreement with those observed in a previous study. The film thickness increment per cycle (FIG. 8), highlighting the existence of deposition reactions occurring during $t_{OFF}$, is shown to reach a plateau of 140 pm per cycle for $t_{OFF}$ greater than 100 ms. This indicates the termination of the free radical polymerization of GMA due to radicals combination reactions occurring for long pause lengths. In consequence, above 315 ms $t_{OFF}$, i.e. DC lower than 0.3%, the film deposition rates become almost null in AC AP-DBD. The maximum deposition rate obtained for short square pulse AP-DBD was obtained for DC of 0.1%, which is two orders of magnitude lower than the one observed for AC experiments. Moreover, higher deposition rates, up to 6.3 nm·s$^{-1}$, were achieved from short square pulse AP-DBD. The use of short square pulse allows the investigation of rather short $t_{OFF}$, below 1 ms, during which the concentration of the free radicals remains high and contribute to the polymer propagation. For $t_{OFF}$ greater than 1 ms, a slope decrease was observed on the film thickness increment plot as a function of cycle duration. This indicates a slowing down of the free radical polymerization process due to a decrease of the free radicals available.

Figure 9:
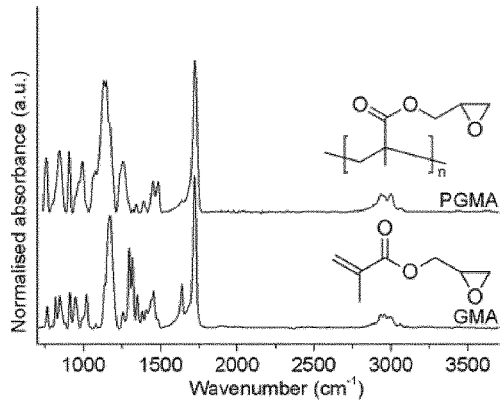
FIG. 9 plots FTIR spectra of the glycidyl methacrylate monomer and of a conventionally polymerized poly(glycidyl methacrylate)
Figure 10:
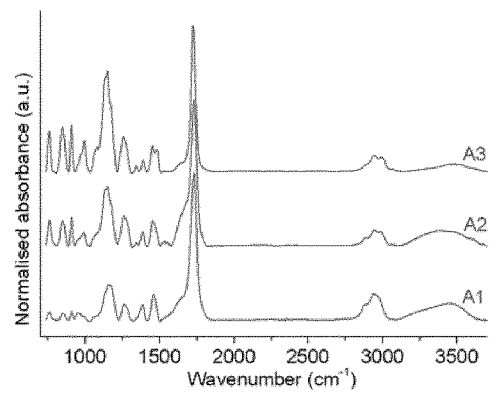
FIG. 10 plots FTIR spectra of polymer thin films grown from various duty cycles using a preferred embodiment of the invention.
Figure 11:
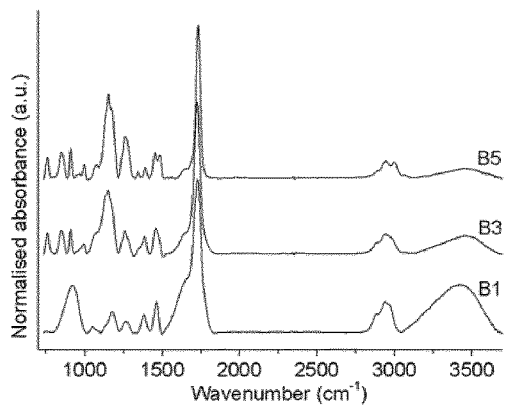
FIG. 11 plots FTIR spectra of polymer thin films grown from various duty cycles using a prior art method.
Figure 12:
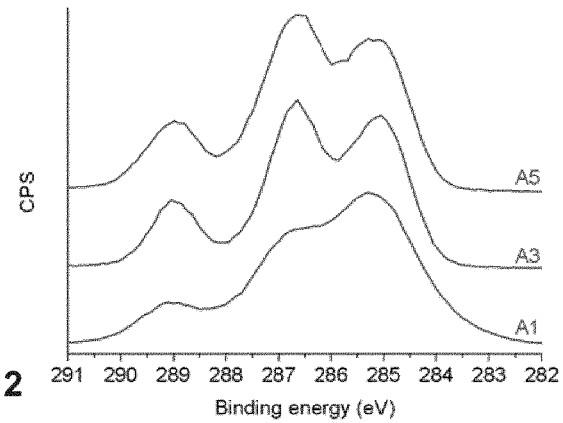
FIG. 12 plots XPS spectra of polymer thin films grown from various duty cycles using a preferred embodiment of the invention.

The growth rate observations demonstrated the occurrence of different mechanisms during $t_{ON}$ and $t_{OFF}$. The combination of these mechanisms is well known to influence the chemical composition and structure of the resulting thin films. The different bonding arrangements in the deposited films were characterized by Fourier transform infrared spectroscopy, FTIR, and compared to those of the liquid GMA monomer and conventionally polymerized PGMA powder (FIGS. 9-11). Irrespective of the plasma electrical excitation, a strong and narrow absorption band assigned to the C=O stretching of the ester group was observed at 1722 cm$^{-1}$. The C=O band, also present on the GMA monomer and PGMA powder spectra and which should not change upon cross-linking, was used to normalized all the spectra. Interestingly, the FTIR spectra of the thin films obtained from the lowest DC (i.e. A3, A4 and A5) match the spectrum obtained for conventionally polymerized PGMA. These samples notably showed an excellent retention of the pendant epoxy groups with the presence of well-defined FTIR absorption bands at 755 cm$^{-1}$, 843 cm$^{-1}$, 905 cm$^{-1}$ and 1253 cm$^{-1}$. Increase of the DC led a peak intensity loss and peak broadening due to the functional group destruction and formation of a larger distribution of chemical bonding. Other peaks at 1448 cm$^{-1}$, 1483 cm$^{-1}$, 2933 cm$^{-1}$ and 2999 cm$^{-1}$, attributed to $CH_3$ vibration modes, were also observed to become broader with increasing DC. It is interesting to note that the C=C stretching band from the methacrylate group of the GMA monomer (1637 cm$^{-1}$), from which the polymerization is supposed to occur, was not observed on the FTIR spectra of the deposited films.

X-ray photoelectron spectroscopy, XPS, showed that all the films contained only carbon and oxygen elements. No evidence of nitrogen contamination from the open air reactor surrounding atmosphere or silicon or aluminum from the substrates was detected. The carbon C 1s core level of the films obtained from various short square pulse AP-DBD conditions is shown on FIG. 10. For the films obtained from DC lower than 0.3%, the C 1s core level envelope was superposable to the one of PGMA, highlighting the existence of the five different carbon environments, namely CH (285.00 eV), $C(CH_3)(CH_2)_2(C=O)$ (285.67 eV), O—$CH_2$—CO (286.71 eV), epoxide CH—O—$CH_2$ (287.02 eV) and C(=O)O (289.15 eV), in ratios close to those of PGMA. Irrespective of the electrical excitation supply, increase of the DC led to an obvious decrease of the epoxy group contribution at 287.02 eV. All these observations are in agreement with the FTIR analyses described previously in this embodiment.

Figure 13:
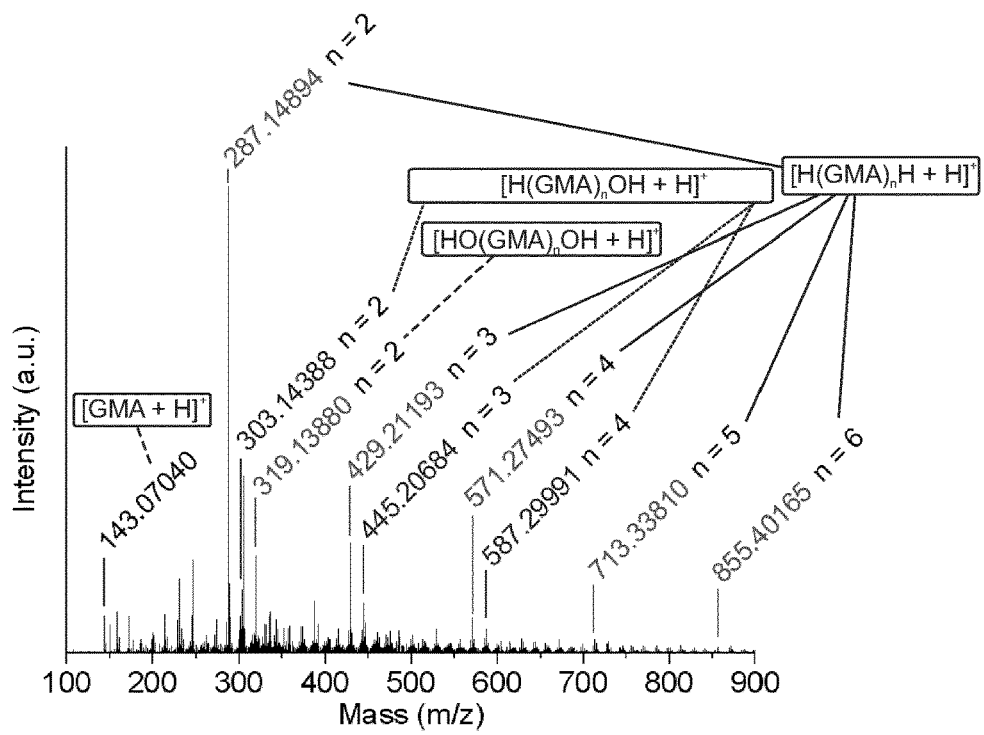
FIG. 13 illustrates AP-MALDI-HRMS results for a sample obtained using a preferred embodiment of the invention.

FTIR and XPS spectra of the film obtained from the lowest DC conditions are shown to be identical to the ones obtained for commercial PGMA (FIGS. 9-12). However, such techniques only give information about the group retention and cannot be used to determine the structure of polymers. To gain insights into the molecular composition of the plasma-polymerized samples, atmospheric pressure matrix-assisted laser desorption/ionization coupled to high-resolution mass spectrometry, AP-MALDI-HRMS, experiments were performed. AP-MALDI-HRMS provides a mass spectrum exhibiting signals related to oligomers of poly (GMA) for samples with duty cycles of 0.1% or below for square-wave pulse AP-DBD and with duty cycles of 0.3% or below for alternating current AP-DBD. A detailed AP-MALDI-HRMS analysis of the sample obtained from a square-wave pulse AP-DBD and a duty cycle of 0.1% (i.e. A3) is presented in FIG. 13 and the main ions of interest are summarized in Table III. The spectrum is dominated by intact oligomers of poly(GMA). The base peak corresponds to a protonated dimer of GMA with protons as end-groups. Such oligomers can be detected up to hexamers in these conditions. In addition to this distribution of intact oligomers, one can observe a significant signal from the monomer ($C_7H_{12}O_3^+$, m/z=143.0704), from oligomers with one or two hydroxyl end groups and from oligomers with modified repeat units. Two main modifications of the repeat unit can be observed. As a first modification, the monomers's epoxy ring can be hydrolysed to form 2,3-dihydroxypropylmethacrylate, DHPMA, at m/z=161.08095 ($[C_7H_{12}O_4+H]^+$). From this DHPMA monomer, GMA can react to form a distribution of oligomers with $[H(DHPMA)_n(GMA)_mH+H]^+$ as a general formula, and measured at m/z=305.15948, 447.22246 and 589.28562 corresponding to poly(GMA) with one hydrolysed epoxy ring. As a second modification, one ester group may be hydrolysed leading to one carboxylic acid repeat unit (isobutyric acid, IBA). Such oligomers with $[H(IBA)_n(GMA)_mH+H]^+$ as a general formula, correspond to signals detected at e.g. m/z=231.12266 and 317.15951, where one GMA repeat unit in attached to one or two isobutyric repeat unit, respectively.

Figure 14:
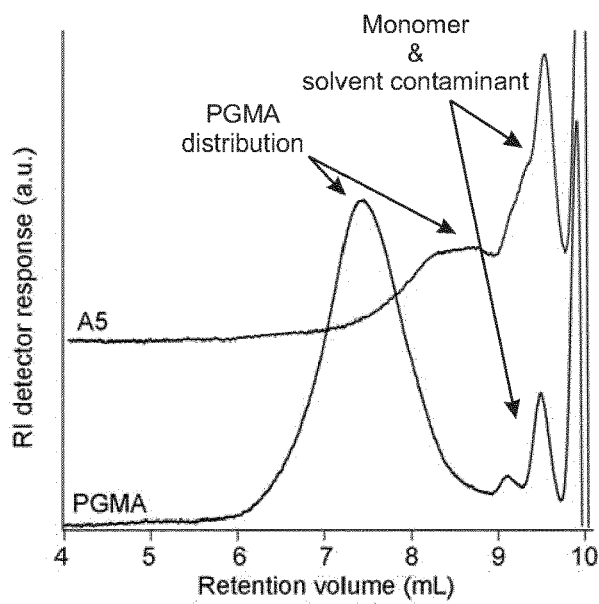
FIG. 14 plots size-exclusion chromatograms of a polymer thin film formed using a preferred embodiment of the invention.

In order to gain information on the molar mass and molar mass distribution of the molecular structures synthetized during the plasma-initiated chemical vapor deposition of GMA, size exclusion chromatography, SEC, analysis was performed on the soluble part of the thin film obtained from square-wave pulse AP-DBD and a 0.01% DC (A5). The resulting SEC chromatogram recorded from the refractive index detector is depicted in FIG. 14, with the chromatogram of a conventionally polymerized PGMA $M_n$=20,000 g·mol$^{-1}$ for sake of comparison. A multimodal distribution is readily detected for the plasma-polymer sample, with very short chains observed as an intense peak immediately before the solvent peak, some oligomers seen as a shoulder of the above-mentioned peaks and longer poly(GMA) species detected as a broad distribution. Conventional calibration using PMMA standards was found to provide accurate mass measurements for the commercial PGMA sample ($M_n$=21, 139 g·mol$^{-1}$, $M_w$=50,512 g·mol$^{-1}$ and $M_p$=33,524 g·mol$^{-1}$), no doubt due to their close chemical composition and structure. Assuming the polymer chains produced in the plasma-polymer are of similar shape than those produced under conventional wet polymerization, species up to 30,000 g·mol$^{-1}$ could be slightly detected in the soluble part of A5 sample, while $M_n$, $M_w$ and $M_p$ values were found around 2,753 g·mol$^{-1}$, 9,086 g·mol$^{-1}$ and 3,253 g·mol$^{-1}$, respectively.

TABLE III

Identification of molecular formulae based on exact mass measurements (error bellow 1 ppm) with proposed assignments for main ions of interest analyzed by AP-MALDI HRMS for the film obtained from a square-wave pulse AP-DBD and a duty cycle of 0.1% (i.e. sample A3).

| Elemental composition | (m/z)$_{exp}$ | Assignment [R(GMA)$_n$R' + X]$^+$ |
|---|---|---|
| $C_7H_{11}O_3^+$ | 143.0704 | $[C_7H_{10}O_3 + H]^+$ |
| $C_7H_{13}O_3^+$ | 145.08601 | $[C_7H_{12}O_3 + H]^+$ |
| $C_{14}H_{23}O_6^+$ | 287.14894 | $[H(C_7H_{10}O_3)_2H + H]^+$ |
| $C_{21}H_{33}O_9^+$ | 429.21193 | $[H(C7H_{10}O_3)_3H + H]^+$ |
| $C_{28}H_{43}O_{12}^+$ | 571.27493 | $[H(C_7H_{10}O_3)_4H + H]^+$ |
| $C_{35}H_{53}O_{15}^+$ | 713.3381 | $[H(C_7H_{10}O_3)_5H + H]^+$ |
| $C_{42}H_{63}O_{18}^+$ | 855.40165 | $[H(C_7H_{10}O_3)_6H + H]^+$ |
| $C_7H_{11}O_4^+$ | 159.06532 | $[C_7H_{10}O_4 + H]^+$ |
| $C_{14}H_{23}O_7^+$ | 303.14388 | $[H(C_7H_{10}O_3)_2OH + H]^+$ |
| $C_{21}H_{33}O_{10}^+$ | 445.20684 | $[H(C_7H_{10}O_3)_3OH + H]^+$ |
| $C_{28}H_{43}O_{13}^+$ | 587.26991 | $[H(C_7H_{10}O_3)_4OH + H]^+$ |
| $C_{35}H_{53}O_{16}^+$ | 729.33343 | $[H(C_7H_{10}O_3)_5OH + H]^+$ |
| $C_{42}H_{63}O_{19}^+$ | 871.39585 | $[H(C_7H_{10}O_3)_6OH + H]^+$ |
| $C_7H_{13}O_5^+$ | 177.07585 | $[HO(C_7H_{10}O_3)_1OH + H]^+$ |
| $C_{14}H_{23}O_8^+$ | 319.1388 | $[HO(C_7H_{10}O_3)_2OH + H]^+$ |
| $C_{21}H_{33}O_{11}^+$ | 461.20184 | $[HO(C_7H_{10}O_3)_3OH + H]^+$ |
| $C_{28}H_{43}O_{14}^+$ | 603.26495 | $[HO(C_7H_{10}O_3)_4OH + H]^+$ |
| $C_{35}H_{53}O_{17}^+$ | 745.3279 | $[HO(C_7H_{10}O_3)_5OH + H]^+$ |
| $C_{42}H_{63}O_{20}^+$ | 887.39097 | $[HO(C_7H_{10}O_3)_6OH + H]^+$ |
| $C_7H_{13}O_4^+$ | 161.08095 | $[C_7H_{12}O_4 + H]^+$ |
| $C_{14}H_{25}O_7^+$ | 305.15948 | $[H(C_7H_{10}O_3)_1(C_7H_{12}O_4)_1H + H]^+$ |
| $C_{21}H_{35}O_{10}^+$ | 447.22246 | $[H(C_7H_{10}O_3)_2(C_7H_{12}O_4)_1H + H]^+$ |
| $C_{28}H_{45}O_{13}^+$ | 589.28562 | $[H(C_7H_{10}O_3)_3(C_7H_{12}O_4)_1H + H]^+$ |
| $C_{21}H_{37}O_{11}^+$ | 465.23287 | $[H(C_7H_{10}O_3)_1(C_7H_{12}O_4)_2H + H]^+$ |
| $C_{11}H_{19}O_5^+$ | 231.12266 | $[H(C_7H_{10}O_3)_1(C_4H_6O_2)_1H + H]^+$ |
| $C_{15}H_{25}O_7^+$ | 317.15951 | $[H(C_7H_{10}O_3)_1(C_4H_6O_2)_2H + H]^+$ |

Figure 15:
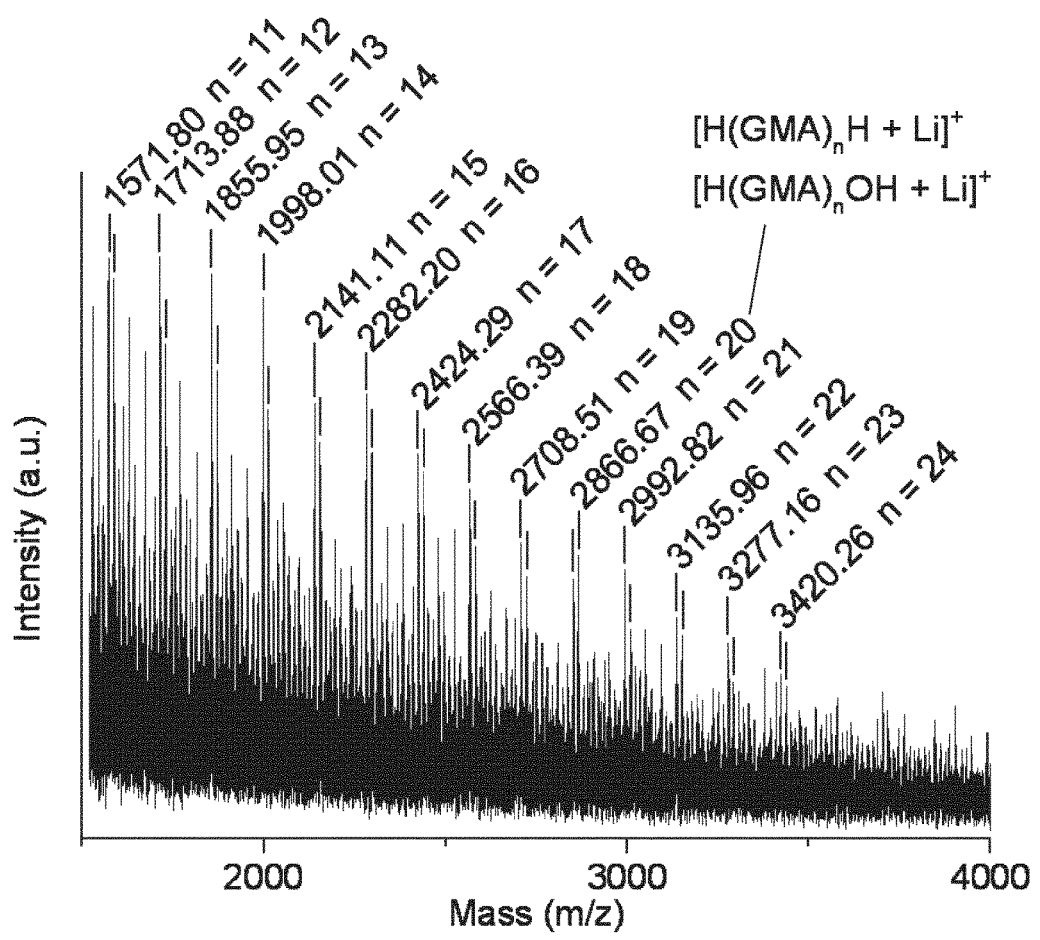
FIG. 15 illustrates MALDI-MS results for a sample obtained using a preferred embodiment of the invention.

MALDI-MS experiments were performed on the THF-soluble part of the film obtained from a square-wave pulse AP-DBD and a duty cycle of 0.01% (sample A5). Results are illustrated in FIG. 15. Three protonated PGMA-like distributions simply described as PGMA backbone with H/H, H/OH and OH/OH as α/ω end-groups were detected (Table IV). Additional series arising from disproportionation reactions and shifted of −2 Da from the above-mentioned main distributions were also observed, while other distributions with undefined end-groups are also slightly detected and listed in Table IV with the molar mass of the α/ω end-groups. Further experiments using triple detection (RID, viscosimeter and right angle/low angle light scattering) were tentatively performed to evidence branching and deviations to the linear PGMA reference compound behavior, but no signals of sufficient quality were recorded.

TABLE IV

Detected ions from the MALDI-MS spectrum of the THF-soluble part of chromatograms of the film obtained from a square-wave pulse AP-DBD and a duty cycle of 0.01% (sample A5) shown in FIG. 15. Proposed assignments are given. No accurate mass measurements could be performed with this device.

| Elemental composition | (m/z)$_{exp}$ | Assignment |
|---|---|---|
| $C_{77}Li_{110}LiO_{33}^+$ | 1569.80 | [PGMA dispropo (n = 9) + Li]$^+$ |
| $C_{84}H_{120}LiO_{36}^+$ | 1711.87 | [PGMA dispropo (n = 10) + Li]$^+$ |
| $C_{91}H_{130}LiO_{39}^+$ | 1853.95 | [PGMA dispropo (n = 11) + Li]$^+$ |
| $C_{98}H_{140}LiO_{42}^+$ | 1996.02 | [PGMA dispropo (n = 12) + Li]$^+$ |
| $C_{105}H_{150}LiO_{45}^+$ | 2138.10 | [PGMA dispropo (n = 13) + Li]$^+$ |
| $C_{112}H_{160}LiO_{48}^+$ | 2280.18 | [PGMA dispropo (n = 14) + Li]$^+$ |
| $C_{77}H_{112}LiO_{33}^+$ | 1571.80 | [PGMA H/H (n = 11) + Li]$^+$ |
| $C_{84}H_{122}LiO_{36}^+$ | 1713.88 | [PGMA H/H (n = 12) + Li]$^+$ |
| $C_{91}H_{132}LiO_{39}^+$ | 1855.95 | [PGMA H/H (n = 13) + Li]$^+$ |
| $C_{98}H_{142}LiO_{42}^+$ | 1998.01 | [PGMA H/H (n = 14) + Li]$^+$ |
| $C_{105}H_{152}LiO_{45}^+$ | 2141.11 | [PGMA H/H (n = 15) + Li]$^+$ |
| $C_{112}H_{162}LiO_{48}^+$ | 2282.20 | [PGMA H/H (n = 16) + Li]$^+$ |
| $C_{119}H_{172}LiO_{51}^+$ | 2424.29 | [PGMA H/H (n = 17) + Li]$^+$ |
| $C_{126}H_{182}LiO_{54}^+$ | 2566.39 | [PGMA H/H (n = 18) + Li]$^+$ |
| $C_{133}H_{192}LiO_{57}^+$ | 2708.51 | [PGMA H/H (n = 19) + Li]$^+$ |
| $C_{140}H_{202}LiO_{60}^+$ | 2851.66 | [PGMA H/H (n = 20) + Li]$^+$ |
| $C_{147}H_{212}LiO_{63}^+$ | 2992.82 | [PGMA H/H (n = 21) + Li]$^+$ |
| $C_{154}H_{222}LiO_{66}^+$ | 3135.96 | [PGMA H/H (n = 22) + Li]$^+$ |
| $C_{161}H_{232}LiO_{69}^+$ | 3277.16 | [PGMA H/H (n = 23) + Li]$^+$ |
| $C_{168}H_{242}LiO_{72}^+$ | 3420.26 | [PGMA H/H (n = 24) + Li]$^+$ |
| $C_{77}F_{1108}LiO_{34}^+$ | 1583.83 | [PGMA « C=O » (n = 9) + Li]$^+$ |
| $C_{84}H_{118}LiO_{37}^+$ | 1725.88 | [PGMA « C=O » (n = 10) + Li]$^+$ |
| $C_{91}H_{128}LiO_{40}^+$ | 1867.94 | [PGMA « C=O » (n = 11) + Li]$^+$ |
| $C_{98}H_{138}LiO_{43}^+$ | 2010.03 | [PGMA « C=O » (n = 12) + Li]$^+$ |
| $C_{105}H_{148}LiO_{46}^+$ | 2152.12 | [PGMA « C=O » (n = 13) + Li]$^+$ |
| $C_{112}H_{158}LiO_{49}^+$ | 2294.18 | [PGMA « C=O » (n = 14) + Li]$^+$ |
| $C_{119}H_{168}LiO_{52}^+$ | 2436.28 | [PGMA « C=O » (n = 15) + Li]$^+$ |
| $C_{77}H_{108}LiO_{34}^+$ | 1585.80 | [PGMA « O » (n = 10) + Li]$^+$ |
| $C_{84}H_{120}LiO_{37}^+$ | 1727.87 | [PGMA « O » (n = 11) + Li]$^+$ |
| $C_{91}H_{130}LiO_{40}^+$ | 1869.93 | [PGMA « O » (n = 12) + Li]$^+$ |
| $C_{98}H_{140}LiO_{43}^+$ | 2012.03 | [PGMA « O » (n = 13) + Li]$^+$ |
| $C_{105}H_{150}LiO_{46}^+$ | 2154.10 | [PGMA « O » (n = 14) + Li]$^+$ |
| $C_{112}H_{160}LiO_{49}^+$ | 2296.20 | [PGMA « O » (n = 15) + Li]$^+$ |
| $C_{119}H_{170}LiO_{52}^+$ | 2438.31 | [PGMA « O » (n = 16) + Li]$^+$ |
| $C_{126}H_{180}LiO_{55}^+$ | 2580.42 | [PGMA « O » (n = 17) + Li]$^+$ |
| $C_{133}H_{190}LiO_{58}^+$ | 2722.52 | [PGMA « O » (n = 18) + Li]$^+$ |
| $C_{140}H_{200}LiO_{61}^+$ | 2864.64 | [PGMA « O » (n = 19) + Li]$^+$ |
| $C_{91}H_{132}LiO_{40}^+$ | 1871.95 | [PGMA H/OH (n = 13) + Li]$^+$ |
| $C_{98}H_{142}LiO_{43}^+$ | 2014.03 | [PGMA H/OH (n = 14) + Li]$^+$ |
| $C_{105}H_{152}LiO_{46}^+$ | 2156.12 | [PGMA H/OH (n = 15) + Li]$^+$ |
| $C_{112}H_{162}LiO_{49}^+$ | 2298.22 | [PGMA H/OH (n = 16) + Li]$^+$ |
| $C_{119}H_{172}LiO_{52}^+$ | 2441.31 | [PGMA H/OH (n = 17) + Li]$^+$ |
| $C_{126}H_{182}LiO_{55}^+$ | 2582.43 | [PGMA H/OH (n = 18) + Li]$^+$ |
| $C_{133}H_{192}LiO_{58}^+$ | 2724.55 | [PGMA H/OH (n = 19) + Li]$^+$ |
| $C_{140}H_{202}LiO_{61}^+$ | 2866.67 | [PGMA H/OH (n = 20) + Li]$^+$ |
| $C_{147}H_{212}LiO_{64}^+$ | 3008.85 | [PGMA H/OH (n = 21) + Li]$^+$ |
| $C_{154}H_{222}LiO_{67}^+$ | 3150.99 | [PGMA H/OH (n = 22) + Li]$^+$ |
| $C_{74}H_{104}LiO_{33}^+$ | 1527.75 | [PGMA (α + ω = 100 + n*142) (n = 10) + Li]$^+$ |
| $C_{81}H_{114}LiO_{36}^+$ | 1669.83 | [PGMA (α + ω = 100 + n*142) (n = 11) + Li]$^+$ |
| $C_{88}H_{124}LiO_{39}^+$ | 1811.92 | [PGMA (α + ω = 100 + n*142) (n = 12) + Li]$^+$ |
| $C_{95}H_{134}LiO_{42}^+$ | 1953.97 | [PGMA (α + ω = 100 + n*142) (n = 13) + Li]$^+$ |
| $C_{102}H_{144}LiO_{45}^+$ | 2096.07 | [PGMA (α + ω = 100 + n*142) (n = 14) + Li]$^+$ |
| $C_{109}H_{154}LiO_{48}^+$ | 2238.18 | [PGMA (α + ω = 100 + n*142) (n = 15) + Li]$^+$ |
| $C_{116}H_{164}LiO_{51}^+$ | 2380.27 | [PGMA (α + ω = 100 + n*142) (n = 16) + Li]$^+$ |
| $C_{123}H_{174}LiO_{54}^+$ | 2522.37 | [PGMA (α + ω = 100 + n*142) (n = 17) + Li]$^+$ |
| $C_{74}H_{106}LiO_{33}^+$ | 1529.77* | [PGMA (α + ω = 102 + n*142) (n = 10) + Li]$^+$ |
| $C_{81}H_{116}LiO_{36}^+$ | 1671.85 | [PGMA (α + ω = 102 + n*142) (n = 11) + Li]$^+$ |
| $C_{88}H_{126}LiO_{39}^+$ | 1813.92 | [PGMA (α + ω = 102 + n*142) (n = 12) + Li]$^+$ |
| $C_{95}H_{136}LiO_{42}^+$ | 1955.98 | [PGMA (α + ω = 102 + n*142) (n = 13) + Li]$^+$ |
| $C_{102}H_{146}LiO_{45}^+$ | 2098.08 | [PGMA (α + ω = 102 + n*142) (n = 14) + Li]$^+$ |
| $C_{109}H_{156}LiO_{48}^+$ | 2240.15 | [PGMA (α + ω = 102 + n*142) (n = 15) + Li]$^+$ |
| $C_{116}H_{166}LiO_{51}^+$ | 2382.27 | [PGMA (α + ω = 102 + n*142) (n = 16) + Li]$^+$ |
| $C_{123}H_{176}LiO_{54}^+$ | 2524.37 | [PGMA (α + ω = 102 + n*142) (n = 17) + Li]$^+$ |

TABLE IV-continued

Detected ions from the MALDI-MS spectrum of the THF-soluble part of chromatograms of the film obtained from a square-wave pulse AP-DBD and a duty cycle of 0.01% (sample A5) shown in FIG. 15. Proposed assignments are given. No accurate mass measurements could be performed with this device.

| Elemental composition | $(m/z)_{exp}$ | Assignment |
|---|---|---|
| $C_{130}H_{186}LiO_{57}^+$ | 2666.42 | [PGMA ($\alpha + \omega = 102 + n*142$) (n = 18) + Li]$^+$ |
| $C_{137}H_{196}LiO_{60}^+$ | 2808.60 | [PGMA ($\alpha + \omega = 102 + n*142$) (n = 19) + Li]$^+$ |
| $C_{144}H_{206}LiO_{63}^+$ | 2950.78 | [PGMA ($\alpha + \omega = 102 + n*142$) (n = 20) + Li]$^+$ |
| $C_{151}H_{216}LiO_{66}^+$ | 3092.92 | [PGMA ($\alpha + \omega = 102 + n*142$) (n = 21) + Li]$^+$ |
| $C_{158}H_{226}LiO_{69}^+$ | 3235.05 | [PGMA ($\alpha + \omega = 102 + n*142$) (n = 22) + Li]$^+$ |
| $C_{165}H_{236}LiO_{72}^+$ | 3375.33 | [PGMA ($\alpha + \omega = 102 + n*142$) (n = 23) + Li]$^+$ |
| $C_{88}H_{126}LiO_{38}^+$ | 1797.93* | [PGMA ($\alpha + \omega = 86 + n*142$) (n = 12) + Li]$^+$ |
| $C_{95}H_{136}LiO_{41}^+$ | 1940.01 | [PGMA ($\alpha + \omega = 86 + n*142$) (n = 13) + Li]$^+$ |
| $C_{102}H_{146}LiO_{44}^+$ | 2082.05 | [PGMA ($\alpha + \omega = 86 + n*142$) (n = 14) + Li]$^+$ |
| $C_{109}H_{156}LiO_{47}^+$ | 2224.15 | [PGMA ($\alpha + \omega = 86 + n*142$) (n = 15) + Li]$^+$ |
| $C_{116}H_{166}LiO_{50}^+$ | 2366.23 | [PGMA ($\alpha + \omega = 86 + n*142$) (n = 16) + Li]$^+$ |
| — | 1613.82 | [PGMA ($\alpha + \omega = 44 + n*142$) (n = 11) + Li]$^+$ |
| — | 1755.90 | [PGMA ($\alpha + \omega = 44 + n*142$) (n = 12) + Li]$^+$ |
| — | 1897.96 | [PGMA ($\alpha + \omega = 44 + n*142$) (n = 13) + Li]$^+$ |
| — | 2040.06 | [PGMA ($\alpha + \omega = 44 + n*142$) (n = 14) + Li]$^+$ |
| — | 2182.14 | [PGMA ($\alpha + \omega = 44 + n*142$) (n = 15) + Li]$^+$ |
| — | 2324.25 | [PGMA ($\alpha + \omega = 44 + n*142$) (n = 16) + Li]$^+$ |
| — | 2466.32 | [PGMA ($\alpha + \omega = 44 + n*142$) (n = 17) + Li]$^+$ |
| — | 2608.42 | [PGMA ($\alpha + \omega = 44 + n*142$) (n = 18) + Li]$^+$ |
| — | 2750.61 | [PGMA ($\alpha + \omega = 44 + n*142$) (n = 19) + Li]$^+$ |
| — | 1627.85 | [PGMA ($\alpha + \omega = 58 + n*142$) (n = 11) + Li]$^+$ |
| — | 1769.92 | [PGMA ($\alpha + \omega = 58 + n*142$) (n = 12) + Li]$^+$ |
| — | 1911.98 | [PGMA ($\alpha + \omega = 58 + n*142$) (n = 13) + Li]$^+$ |
| — | 2054.05 | [PGMA ($\alpha + \omega = 58 + n*142$) (n = 14) + Li]$^+$ |
| — | 2196.17 | [PGMA ($\alpha + \omega = 58 + n*142$) (n = 15) + Li]$^+$ |
| — | 2338.23 | [PGMA ($\alpha + \omega = 58 + n*142$) (n = 16) + Li]$^+$ |
| — | 2480.36 | [PGMA ($\alpha + \omega = 58 + n*142$) (n = 17) + Li]$^+$ |
| — | 2622.48 | [PGMA ($\alpha + \omega = 58 + n*142$) (n = 18) + Li]$^+$ |
| — | 1643.83 | [PGMA ($\alpha + \omega = 74 + n*142$) (n = 11) + Li]$^+$ |
| — | 1785.91 | [PGMA ($\alpha + \omega = 74 + n*142$) (n = 12) + Li]$^+$ |
| — | 1927.98 | [PGMA ($\alpha + \omega = 74 + n*142$) (n = 13) + Li]$^+$ |
| — | 2070.08 | [PGMA ($\alpha + \omega = 74 + n*142$) (n = 14) + Li]$^+$ |
| — | 2212.13 | [PGMA ($\alpha + \omega = 74 + n*142$) (n = 15) + Li]$^+$ |
| — | 2354.25 | [PGMA ($\alpha + \omega = 74 + n*142$) (n = 16) + Li]$^+$ |
| — | 2496.40 | [PGMA ($\alpha + \omega = 74 + n*142$) (n = 17) + Li]$^+$ |

1.2.3. Free Radical Plasma-Initiated Chemical Vapor Deposition

Numerous previous works reported how the plasma electrical excitation frequency could influence the morphology and chemistry of the films deposited by AP-DBD. SEM and AFM observations notably showed how the electrical excitation can favor or prevent the formation of particles, heterogeneities or pinholes in the coatings. In parallel, chemical investigations highlighted a better monomer structure retention when using longer plasma $t_{OFF}$ periods. Higher functional group retention is usually induced by the monomer free radical polymerization occurring during $t_{OFF}$. In contrast, shorter plasma $t_{OFF}$ induces a high rate of random side cross-linking reactions and lead to the formation of new chemical groups. Using the present invention, the free radical polymerization of a methacrylate functional group containing monomer was enhanced by using plasma DC lower than 0.1%. In classical AC AP-DBD, such low duty cycles imply the use of plasma $t_{OFF}$ in the hundreds of millisecond range, leading to extremely slow growth rates.

In contrast, ultra-short square pulse dielectric barrier discharge can allow the use of DC far below 0.1% while keeping $t_{OFF}$ in the millisecond range. In consequence, high growth rates, even superior to the highest achieved in AC AP-DBD, are obtained. The fast voltage rise time (30 ns) produce a short and homogeneous current discharge (100 ns) with a large proportion of high energy electrons which efficiently induced the formation of free radicals that will initiate the free radicals polymerization process. The impact of the plasma discharge, occurring twice 100 ns every 1 to 10 ms, on the resulting thin film chemistry is thus minimized. On the other hand, the free radical polymerization reaction, occurring solely during more than 99.9% of the deposition process, is massively favored. Therefore, thin films composed of well-defined polymer repeat units, such as observed by MALDI-HRMS, are grown.

As shown within this study, ultra-short square pulse dielectric barrier discharge is particularly suitable for the deposition of thin films with a high retention of the epoxy groups. Other labile functional groups, which are easily cleaved off in PE-CVD processes, may also be retained thanks to the use of nanosecond or microsecond-pulsed AP-DBD. Beyond the functional groups retention interest, ultra-short square pulse dielectric barrier discharge is also shown to lead to the formation of a homopolymer layer. The plasma deposition method described in this embodiment is opening a new route towards the chemical vapor deposition of functional homo- and copolymers. The plasma initiated chemical vapor deposition technology, PiCVD, currently investigated for the deposition of electrically conducting polymers as thin film, may also be suitable for the deposition of responsive conductive layers, which require linear polymer structures.

1.3. Conclusions

Whereas previously known CVD methods adopted to achieve polymer layers imply the use of reduce pressure, ultra-short square pulse dielectric barrier discharge provides a simple one-step atmospheric pressure and room temperature process for the deposition of homopolymers. Thanks to a fast voltage rise (30 ns), a short and homogeneous discharge with a large proportion of high energy electrons was generated and the free radical polymerization of GMA initiated. The effect of plasma on the GMA monomer was minimized by employing duty cycles as low as 0.01% and the free radical polymerization reaction occurring during $t_{OFF}$ was greatly favored to deposited PGMA layers. An excellent retention of the labile functional epoxy groups was shown by FTIR and XPS. The polymer structure of the thin films was evidenced by matrix-assisted laser desorption/ionization high-resolution mass spectrometry. Polymer layers with weight-average molecular weight up to 30,000 g·mol$^{-1}$ were deposited. Ultra-short square pulse dielectric barrier discharge is opening a new route towards the chemical vapor deposition of functional homo- and copolymers and is currently investigated for the deposition of electrically conducting polymers as thin film.

2. Atmospheric Pressure Plasma Initiated Chemical Vapor Deposition of a Conventional poly(diethylallylphosphate) Using Unipolar Nanosecond Square Pulse Dielectric Barrier Discharge.

In this embodiment, the possibility to deposit a conventional polymer by AP-PiCVD through free-radical polymerization thanks to an ultra-short square-pulsed DBD is described.

2.1 Experimental Part 2.1.1 Materials

DEAP (diethylallyl phosphate) was obtained from Sigma-Aldrich™ and used without further purification (98%).

2.1.2 Deposition of Coatings

The direct dielectric barrier discharge configuration used in this study is summarized as follows. The discharge was produced between two plane-parallel high voltage electrodes (15 mm×74 mm each) covered by an alumina dielectric barrier and a moving stage as the grounded electrode. Prior to any plasma treatment, the plasma chamber was pumped to a vacuum of 20 Pa and then filled to atmospheric pressure with the desired gas mixture (argon in this case). This procedure was repeated three times to ensure homogeneity and high gas purity of the discharge. The gap between the high voltage electrodes and the substrate was maintained at 1 mm. The organophosphorus precursor (DEAP, $C_7H_{15}O_4P$) was introduced into the discharge using a bubbler system made of a cylinder and a frit. This latter was thermostatically controlled (298 K) and the gas pipes were slightly heated (308 K) to prevent the precursor from any condensing phenomena on the inner pipe surface. The concentration of precursor is close to 20 ppm. Total flow rate was maintained at 5 standard liters per minute (slm) for all the experiments and the atmospheric pressure was kept constant by a slight pumping. During the deposition process in accordance with the invention, the plasma was initiated using the generator AHTPB10F from Effitech™ generating ultrashort square pulse. Another kind of generator was also employed to initiate the plasma with a standard sinusoidal signal of 10 kHz (Corona generator, SOFTAL Electronic™ GmbH), as known in the art. In that case, coatings were deposited using a modulated sinusoidal electrical excitation varying from a continuous wave, CW, to a pulsed wave, PW, with different on-time and off-time pulses, labelled $t_{on}$ and $t_{off}$, respectively. The time-off was set to 30 ms in order to renew the gas mixture between the electrodes before each time-on.

The substrates to be coated were 275 µm thick silicon wafers (intrinsic, double side polished, Siltronix™). Substrates were first cleaned by acetone and alcohol in an ultrasonic bath before each manipulation and plasma activated during 30 seconds to an $N_2$:$O_2$ (95:5%) atmospheric pressure dielectric barrier discharge just before deposition.

2.1.3. Thin Film Characterisation Techniques

The samples were weighted using a Sartorius™ ME-36S microbalance. Weighting measurements of the samples were performed three times before and after each deposition to monitor the mass deposition rate.

Coatings thicknesses were evaluated by means of spectroscopic ellipsometry (AutoSE™, Horiba Scientific) at an angle of incidence of 70°, in a spectral range from 440 to 1000 nm. The used ellipsometric model assumes that the samples were made of a semi-infinite silicon substrate covered by a 2 nm thick silicon dioxide layer (native oxide layer) and the plasma thin film on the top. Plasma polymerised layers were assumed to be homogeneous, non-porous, isotropic, and were simulated using a dispersion law. Roughness was supposed to be negligible.

FTIR analyses were performed either in transmission mode on a Bruker™ Hyperion 2000 spectrometer and using a liquid $N_2$ cooled mercury cadmium telluride, MCT, detector. Spectra were acquired by averaging 500 scans with a spectral resolution of 4 cm$^{-1}$. The signal was smoothed by a Savitzky-Golay filter considering 20 points at each individual point for the smoothing routine.

X-ray Photoelectron Spectroscopy, XPS, measurements were carried out on a Kratos™ AXIS Ultra DLD XPS system equipped with a hemispherical energy analyser and a monochromatic Al $K_\alpha$ X-ray source (hv=1486.6 eV) operated at 150 W. The pass energy was fixed at 160 eV for survey scans and 40 eV for core level spectra, with an analysis area of 300×700 µm. Charge neutralizer was used to compensate for the charge. All spectra were calibrated using the carbon is peak aliphatic contribution at 285.0 eV. No etching step was performed prior to the analyses. The XPS spectra were processed with CasaXPS™ software and a Shirley-type background was subtracted from the spectra. Peaks were fitted with a Gaussian/Lorentzian (70%-30%) line shape.

2',4',6'-Trihydroxyacetophenone monohydrate, THAP, matrix solution at 30 mg/mL concentration in acetone was applied to the plasma polymer coatings. MALDI-MS analysis was performed using an atmospheric pressure ion source (AP-MALDI, MassTech™, Columbia, Md., USA) coupled to a hybrid linear trap/Orbitrap analyser (LTQ-Orbitrap Elite™, Thermo Fisher Scientific GmbH, Bremen, Germany). The mass spectrometer was operated in positive ion mode at a mass resolution, FWHM, fixed to 120,000. The ion source was equipped with a Nd:YAG laser ($\lambda$=355 nm), operating at a repetition rate of 200 Hz, for desorption/ionization. Internal calibration was performed using matrix ion signal as a lock mass of protonated dimer THAP at m/z=335.07614, resulting in mass accuracy of typically better than 2 ppm.

Figure 16:
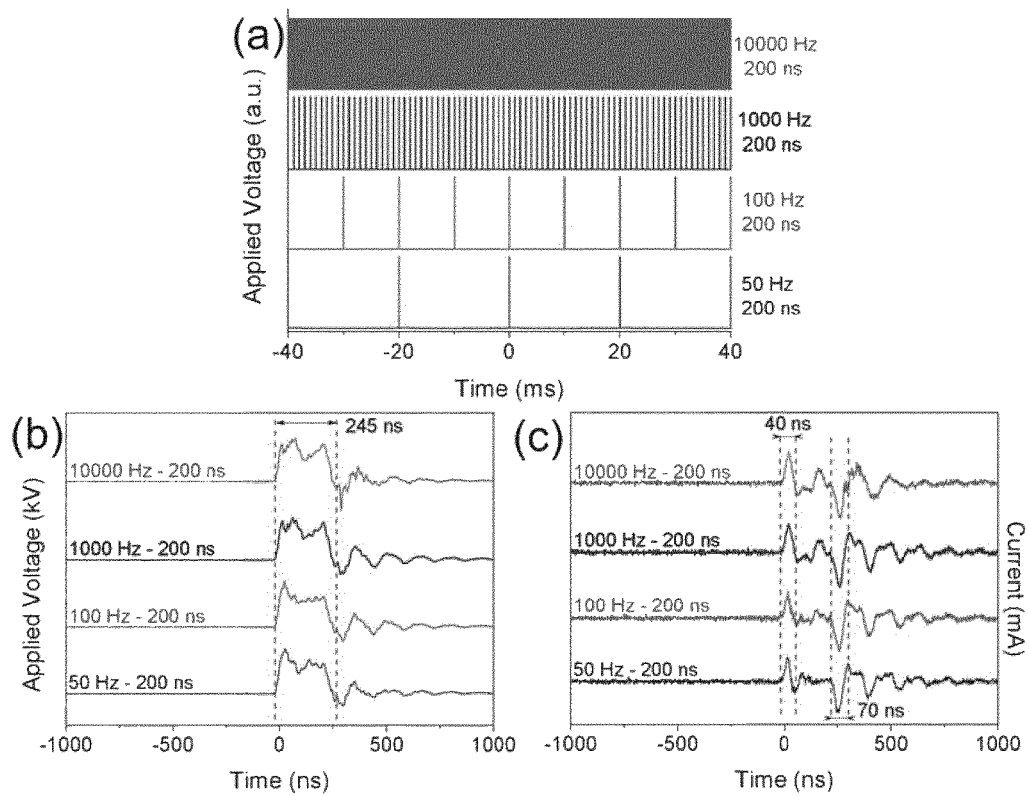
FIGS. 16a and 16b shows different frequency voltage pulsations used in accordance with a preferred embodiment of the invention.
FIG. 16c shows different discharge currents associated with the pulsations shown in FIGS. 16a and 16b.

2.2 Results and Discussion 2.2.1. Electrical Characterization of the Ultrashort Square Pulse Dielectric Barrier Discharge The originality of the present study is to investigate the benefit of ultrashort square-pulsed DBD for the PiCVD of organic coatings. Electrical measurements were performed to characterise the discharge. FIG. 16a depicts the different frequency of pulsation used from 50 Hz to 10 kHz. Indeed, the square wave alternates minimum and maximum amplitude values with a repetition rate equal to the frequency. Then, it is possible to tune the duration of the plasma-off time (minimum amplitude value) by playing on the frequency of the signal. For example, a frequency of 50 Hz has a repetition rate equal to 20 ms, whereas a frequency of 10 kHz has a repetition rate equal to 0.1 ms. In this study, the pulse discharge duration was kept constant at 245 ns. Then, the range of frequency investigated allows the study of the influence of the time-off on the deposition mechanisms, while the nanosecond square pulse was chosen to limit the fragmentation of the monomer and to favour the activation of the reactive groups as an initiation step.

FIG. 16b shows the applied voltage for the different electrical excitations frequencies used in this study. The voltage pulses have durations of 245 ns and a rise time of 45 ns. Two current pulses are observed for each voltage pulse with periods of 40 ns and 70 ns, respectively (FIG. 16c). The first current pulse is produced as the applied voltage exceeds the breakdown voltage of the gas and the second represents the discharge occurring on the falling edge of the voltage pulse. The smooth curves of the current pulses indicate a diffuse discharge, since the current trace of a filamentary discharge consists of many narrow spikes. Therefore, these repeatable ultrashort pulses produce a homogeneous discharge in a very short time, leading to two discharge currents occurring rapidly. This is suitable to prevent the monomer from fragmenting hugely and for the structure retention of the monomer.

However, even if nanopulses can promote structure retention, the frequency of repetition has to be considered. Indeed, if the nanopulses are considered as the initiation step, there must be a propagation step to let the polymerisation occurring. Then, no plasma is needed anymore and the time-off should play this role. To demonstrate this interest, different plasma-off duration were used. The frequency was modified to perform the different time-off period, as explained above, and implementing a duty-cycle DC ranging from 0.001% to 0.2%.

2.2.2 Thin Film Growth Rate Characterization

The growth rate of the coatings was monitored in weight and thickness according to the conditions described in Table V.

TABLE V

Deposition conditions and deposition rates for different frequency of ultrashort square pulse.

| Electrical parameters | | | | Deposition rate | |
|---|---|---|---|---|---|
| Frequency (Hz) | Pulsation (ns) | Applied Voltage (kV) | Duty cycle (%) | Thickness (nm · min$^{-1}$) | Mass (µg · min$^{-1}$ · cm$^{-2}$) |
| 50 | 245 | 2.5 | 0.001 | 19 | 2.162 |
| 100 | | | 0.002 | 31 | 3.581 |
| 1,000 | | | 0.02 | 32 | 5.401 |
| 10,000 | | | 0.2 | 8 | 3.516 |

First, it can be seen that the mass deposition rate follow the same trend as the thickness rate. An increase of the deposition rate is observed up to a frequency of 1 kHz, then a decrease can be noticed at 10 kHz. It is therefore possible to consider the influence of the time-off on the deposition kinetic.

Figure 17:
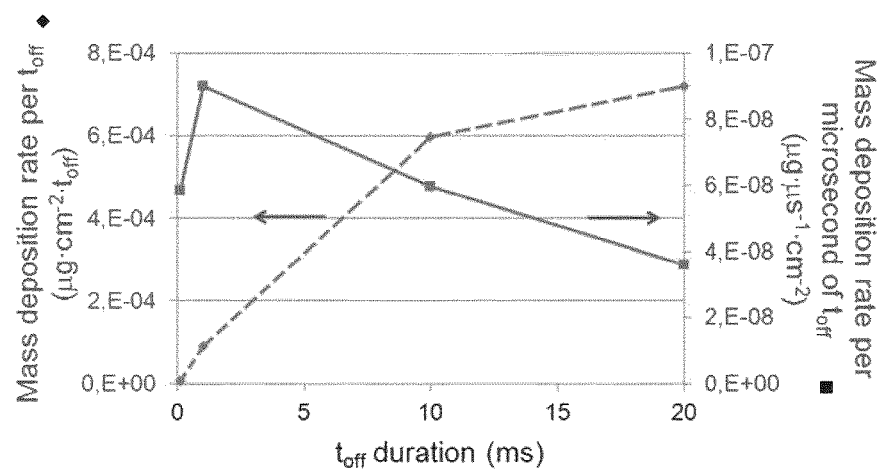
FIG. 17 illustrates mass deposition rates observed using a preferred embodiment of the invention.

To highlight this influence, it is interesting to plot the deposition rates which occur during plasma-off time. FIG. 17 represents the mass deposition rate per $t_{off}$ period (left, continuous line) and during one microsecond of time-off period (right, dashed line). The growth rate of the coatings clearly increases with the duration of the $t_{off}$ as it is equal to 6 pg·cm$^{-2}$·$t_{off}$ for a frequency of 10 kHz and reach 721 pg·cm$^{-2}$·$t_{off}$ for 50 Hz.

However, it is also important to consider the effectiveness of the deposition rate, i.e. the deposition rate over the same period. Then, two distinct periods can be obviously determined, time-on and time-off. Nevertheless, as the plasma-on time is set constant for all the conditions studied, only the deposition rate during the time-off period over the same time has been investigated. Thus, different results can be observed as the deposition rate occurring in 1 ms of the time-off reach its maximum for a frequency of 1 kHz (1 ms). As the deposition which occurs during the time-on is negligible compared to the one of the $t_{off}$, the deposition rate per microsecond of time-off can be considered as the propagation rate of the species activated during the $t_{on}$. Indeed, the ultrashort plasma pulse provides the source of energy which activates the monomer into radicals through the allyl reactive group. During the time-off, the radicals generated will propagate and exhaust gradually with time. As it can be seen, the propagation of the activated species reaches its maximum rate for a duty cycle of 0.02%, which could mean that the radicals amount decrease after 1 ms of plasma-off time and therefore the deposition rate during $t_{off}$.

Figure 18:
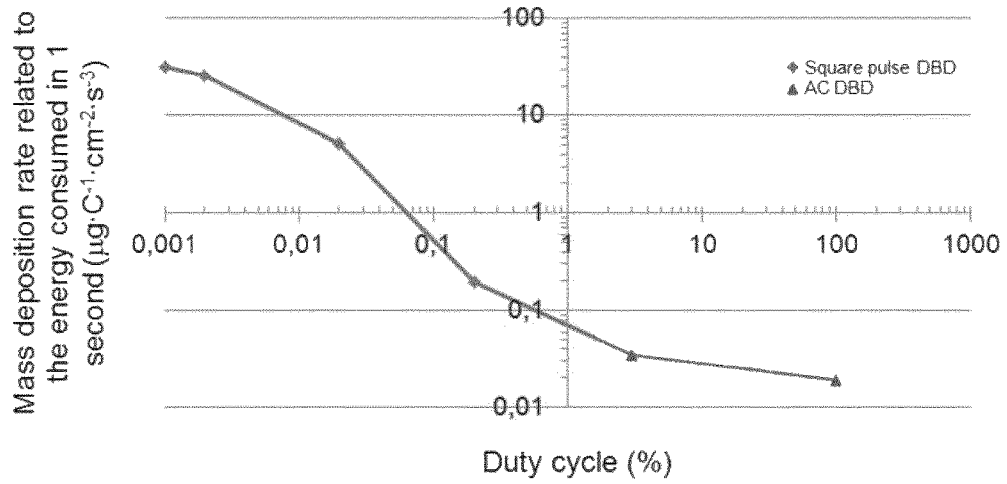
FIG. 18 illustrates the mass deposition rate efficiency considering the energy used in 1 second observed using a preferred embodiment of the invention for different duty cycles.

Furthermore, considering that most of the deposition mechanism takes place during the time-off period, then it is interesting to underline that the time-on period could be reduce to prevent the monomer from being fragmented and to save energy in the deposition process. FIG. 18 depicts the evolution of the mass deposition rate in function of the duty cycle and taking into account the energy used during the plasma-on time. Classical AC DBD coatings were realized for comparison with duty cycles of 3% and 100%. It can be highlighted that square pulse DBD enables higher deposition rates than AC DBD considering the same energy consumed in 1 second. The deposition rate occurring with the shortest duty cycle is the most efficient deposition process in terms of deposition rate per energy consumed. Ultrashort square pulse can then be considered as an energy saving process compared to AC AP-DBD.

It is clear that different mechanisms happen in the gas phase as the propagation is not linear with the $t_{off}$ duration, then it should be possible to determine different tendencies in the chemistry of the coatings.

Table VI reports the relative atomic concentration of the different coatings obtained in function of the duty cycle measured by XPS. To better apprehend these results, the atomic concentrations of polyDEAP polymerised by the conventional method is added.

Figure 19:
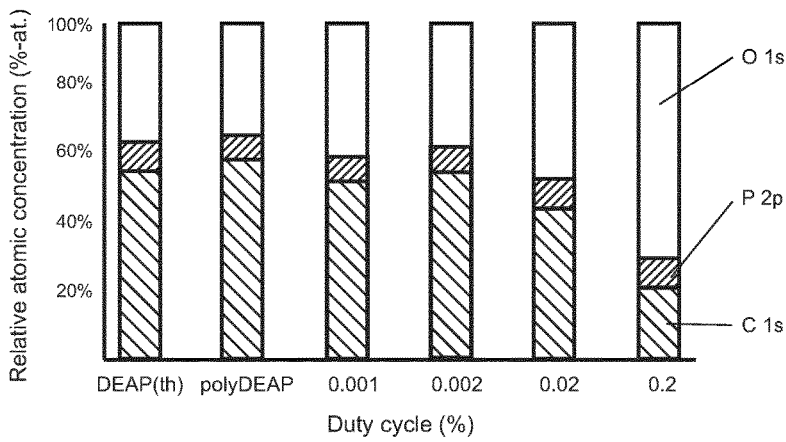
FIG. 19 illustrates relative atomic concentrations of polymer films deposited using a preferred embodiment of the invention, and of DEAP and polyDEAP.

XPS elemental concentrations, illustrate in FIG. 19, confirm the possibility to tune the chemistry of the coatings depending on the duty cycle used. The conventional polymerised polyDEAP is included for comparison. High organic contents are present for low duty cycles, whereas the amount of carbon clearly decreases when the duty cycle increases. The loss of carbon is followed by a rise of oxygen quantity, meanwhile the concentration of phosphorus is almost constant. In comparison with the elemental concentration of the polyDEAP used as reference, low duty cycles are obviously needed to prevent the monomer from being significantly modified.

TABLE VI

Relative atomic concentration of the deposited films and polyDEAP.

| | Duty cycle (%) | Frequency (Hz) | C (%) | O (%) | P (%) |
|---|---|---|---|---|---|
| polyDEAPexp. | — | — | 62 | 31 | 7 |
| Square pulse | 0.001 | 50 | 56 | 37 | 7 |
| | 0.002 | 100 | 59 | 34 | 7 |
| | 0.02 | 1.000 | 48 | 44 | 8 |
| | 0.2 | 10.000 | 25 | 65 | 10 |

Figure 20:
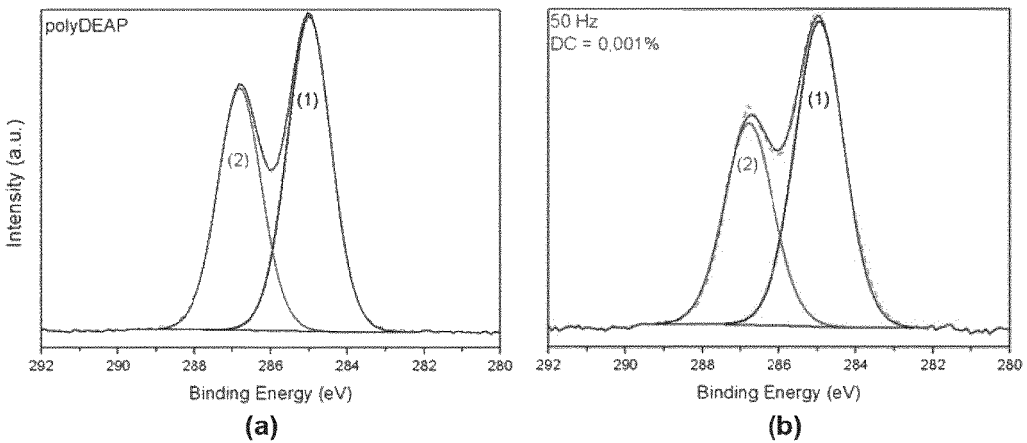
FIG. 20 illustrates high-resolution XPS spectra of the C 1s contributions of conventional polymerized polyDEAP and plasma polymerized DEAP with a duty cycle of 0.001% in accordance with a preferred embodiment of the invention.

High-resolution XPS spectrum of the conventional polyDEAP was compared to the one of the coating with the "softest" plasma conditions and which was proved to be the one with the more retention of the monomer structure, i.e.

the coating realised with a frequency of 50 Hz (FIG. 20). Table VII displays the relative concentration of the contribution of each coating for the contribution of the carbon is.

TABLE VII

Relative concentration (% area) of the contributions related to the FIG. 20.

| Peak assignement | 1<br>C—C/C—H | 2<br>C—O(/C≡N) |
|---|---|---|
| polyDEAP | 57 | 42 |
| 50 Hz-DC = 0.001% | 60 | 40 |

Here again, the characteristics of the polyDEAP is perfectly identical to the contributions of the coating realised by AP-PECVD. The contribution attributed to the nitrile has been supposed for the polyDEAP due to the possible contribution of the end-groups, coming from the AIBN radicals.

The FTIR spectra depicted by FIG. 21 enable to go further in the analysis of the retention structure of the different coatings.

DEAP polymers obtained by conventional free-radical polymerisation and nanopulse DBD for conditions described previously, were analysed. Different categories can be outlined. The first one (DC=0.001% and DC=0.002%) is composed of spectra with a fingerprint relatively close to the polyDEAP pattern. The structure retention of the monomer is confirmed as the bands assigned to v(P—O—C) and $\delta(CH_3)_{rocking}$ are conserved in accordance to the polyDEAP spectrum. Only the difference in intensity and a slight broadening of the bands have to be noticed. The second category includes the highest duty cycles (DC=0.02% and 0.2%) and differs a bit from the reference. The disappearance of the vibration band associated to $\delta(CH_3)_{rocking}$ at 1105 cm$^{-1}$ (DC=0.02%) and the red-shift of the P—O group indicate a loss the organic character of the coatings, which correlates the observations made with the elemental compositions of the deposits.

So far, it has been presented that using unipolar square nanopulse with a duty cycle of 0.001% is the best way to obtain a coating with high monomer structure retention. Therefore, high-resolution mass spectrometry was performed to highlight the chemical structure of the coating compared to the polyDEAP of reference.

After matrix THAP deposition, the mass spectrum was acquired in positive ion mode with the AP-MALDI-MS. Molecular structures were identified and assigned thank to the high mass accuracy provided by the Orbitrap™ analyzer (<2 ppm). The presented mass spectrum was obtained after subtraction of the matrix THAP signal. FIG. 22 shows the molecular structure of polyDEAP corresponding to the chemical formula: $[H(C_7H_{15}PO_4)_n H+H]^+$ with "n" number of repeating units (FIG. 22a), the mass spectrum in mass range m/z=100-1000 (FIG. 22b), and mass spectrum corresponding to the enlargement in mass range m/z=360-410 (FIG. 22c). The mass spectrum was dominated by the polyDEAP proton adduct with proton terminal groups $[H(C_7H_{15}PO_4)_n H+H]^+$. Moreover, oligomers were detected with a high mass accuracy (<1 ppm) and repeating units up to n=9 (data not shown). Only oligomers up to 5 repeating units were shown (FIG. 22b). The enlargement shows two modifications of molecular structures corresponding to the $C_2H_2$ neutral loss at m/z=363.13319 assigned to $[H(C_7H_{15}PO_4)(C_5H_{11}PO_4)H+H]^+$, and a hydroxyl terminal group at m/z=407.15928 assigned to $[H(C_7H_{15}PO_4)_2 OH+H]^+$, with a low mass deviation −0.075 ppm and −0.373 ppm, respectively. These both modifications were also detected with oligomers with up to n=9 repeating units.

For unipolar square nanopulses, it has been demonstrated that two discharge currents of ns and 70 ns occur at the rise and fall of each pulse. These ultrashort pulses produce a homogeneous discharge with low gas temperature and average power but with very high electron density due to the fast-rising pulses. The production of high energy electrons increases the ionisation and results in the efficient formation of key radical species. Furthermore, nanopulsing the discharge is an energy saving process as the power dissipated in the discharge is low and short.

It is known that the faster the rise rate is, the more reactive the plasma is, as the ionisation and excitation processes of the plasma could be enhanced with more atoms excited. Those discharges have been applied to a monomer to produce organic coatings. The deposition rates of the coatings were monitored and highlighted several deposition mechanisms. Indeed, the deposition rate during 1 μs of the $t_{off}$ increases up to duration of 1 ms (1000 Hz) and then decreases. So the—energetic species/propagation—ratio is optimum for 1 ms of time-off. Then, it can be considered that up to 1 ms, different energetic species are present and there is a mix between reactive species which enhance crosslinked plasma polymer structure and free-radicals which favours classical free-radical propagation. Then, after 1 ms, free-radicals are the only one to be still present and enable classical polymerisation. That's why the polyDEAP is obtained by long $t_{off}$ (50 Hz).

2.3 Conclusion

In the described embodiment of the invention, unipolar square nanopulses have been employed to polymerise diethylallyl phosphate via free-radical polymerisation thanks to a novel method: Plasma-initiated Chemical Vapour Deposition (PiCVD). While ultrashort pulses create radicals, the time-off periods enable the propagation of the radicals and the polymerisation of the DEAP.

The originality of this study is to perform organic coatings through free-radical polymerisation thanks to an ultrashort square-pulsed DBD.

The features of the described embodiments may be substituted and complemented with each other, or combined in any suitable manner. Furthermore, the person skilled in the art will be able to adapt these features in view of specific conditions, setups or applications while remaining within the scope of the present invention, which is defined by the set of claims appended hereto.

The invention claimed is:

1. A method for forming a polymer film on a substrate, comprising the following subsequent steps:
   providing a mixture comprising at least one polymer forming material; and
   applying a sequence of atmospheric plasma pulses to the mixture in order to form a polymer film on a surface portion of a substrate, which is contacted by said mixture;
   wherein each plasma pulse presents a duration $t_{ON}$, comprised between one nanosecond and one microsecond, during which the plasma is discharged, and a duration $t_{OFF}$, comprised between one microsecond and one second, during which the plasma is not discharged; and
   wherein the duty-cycle of a plasma pulse $t_{ON}/(t_{ON}+t_{OFF})$ is lower than 0.1%.

2. The method according to claim 1, wherein each plasma discharge is generated by a voltage pulse, which rises to the plasma discharge breakdown voltage in one nanosecond to one microsecond.

3. The method according to claim 2, wherein the voltage rise rate of the voltage pulse is of at least 10 V·ns$^{-1}$.

4. The method according to claim 2, wherein the voltage pulses are repeated at a frequency which is lower than one of the following:
one kHz; and
one hundred Hz.

5. The method according to claim 2, wherein the voltage pulse is a square wave voltage pulse.

6. The method according to claim 5, wherein the square wave is a bipolar square wave.

7. The method according to claim 5, wherein the square wave is a positive or negative unipolar square wave.

8. The method according to claim 2, wherein the duration of a voltage pulse is comprised between one nanosecond and one second.

9. The method according to claim 1, wherein each plasma discharge is generated by a microwave pulse.

10. The method according to claim 1, wherein the polymer forming material comprises a monomer.

11. The method according to claim 10, wherein the monomer is a molecule comprising at least one polymerisable group including unsaturated groups, or a molecule having a cyclic structure.

12. The method according to claim 1, wherein the mixture is a gas, vapor, liquid, aerosol or solid.

13. The method according to claim 1, wherein the mixture comprises at least one organic solvent.

14. The method according to claim 1, wherein said surface portion of the substrate comprises an insulating, semiconducting or conducting material.

15. The method according to claim 1, wherein the substrate and/or a plasma deposition chamber is provided at a temperature comprised between −50 and 20° C.

16. The method according to claim 1, wherein the substrate and/or a plasma deposition chamber is provided at a temperature comprised between 20 and 100° C.

17. The method according to claim 1, wherein a plasma process gas comprises at least one gas selected from the group comprising argon, carbon dioxide, helium, hydrogen, nitrogen and oxygen.

18. The method according to claim 1, wherein a plasma process gas comprises at least one polymer forming material.

19. The method according to claim 1, wherein the substrate and plasma are provided in an enclosure comprising an atmosphere which comprises at least 99% of Ar, He, $N_2$ or air.

20. The method according to claim 1, wherein a plasma process gas comprises a gaseous or vaporous polymerization initiator.

21. The method according to claim 20, wherein the gaseous initiator is selected from the group comprising peroxides, aryl ketones and alkyl azo compounds.

22. The method according to claim 1, wherein a plasma process gas comprises an oxidizing agent.

23. The method according to claim 22, wherein the oxidizing agent is selected from the group comprising bromine, bromide compounds, chlorine, chloride compounds, chlorite compounds, chlorate compounds, chromate compounds, chromic acid, dichromic acid, dichromate compounds, perchlorate compounds, fluorine, fluoride compounds, hexavalent chromium compounds, hydrogen peroxide, hypochlorite compounds, hypohalite compounds, inorganic peroxides, iodine, iodide compounds, nitrate compounds, nitric acid, nitrous oxide, osmium tetroxide, oxygen, ozone, peroxydisulfuric acid, peroxymonosulfuric acid, potassium nitrate, silver oxide, sodium perborate, sulfuric acid and water.

* * * * *